(12) United States Patent
Kim et al.

(10) Patent No.: US 11,804,528 B2
(45) Date of Patent: Oct. 31, 2023

(54) SEMICONDUCTOR DEVICE

(71) Applicant: SAMSUNG ELECTRONICS CO., LTD., Suwon-si (KR)

(72) Inventors: Sang Young Kim, Suwon-si (KR); Byung Chan Ryu, Seongnam-si (KR); Da Un Jeon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 206 days.

(21) Appl. No.: 17/325,466

(22) Filed: May 20, 2021

(65) Prior Publication Data
US 2022/0085179 A1 Mar. 17, 2022

(30) Foreign Application Priority Data
Sep. 11, 2020 (KR) .................. 10-2020-0116578

(51) Int. Cl.
*H01L 29/417* (2006.01)
*H01L 23/522* (2006.01)
*H01L 29/45* (2006.01)
*H01L 29/423* (2006.01)
*H01L 23/528* (2006.01)
*H01L 23/532* (2006.01)
*H01L 29/786* (2006.01)

(52) U.S. Cl.
CPC .... *H01L 29/41791* (2013.01); *H01L 23/5226* (2013.01); *H01L 23/5283* (2013.01); *H01L 29/41733* (2013.01); *H01L 29/42372* (2013.01); *H01L 29/42392* (2013.01); *H01L 29/456* (2013.01); *H01L 23/53223* (2013.01); *H01L 23/53238* (2013.01); *H01L 23/53252* (2013.01); *H01L 23/53266* (2013.01); *H01L 29/78696* (2013.01)

(58) Field of Classification Search
CPC .................. H01L 23/5226; H01L 23/5283
See application file for complete search history.

(56) References Cited

U.S. PATENT DOCUMENTS

| | | | |
|---|---|---|---|
| 6,613,664 B2 | 9/2003 | Barth et al. | |
| 8,125,085 B2 | 2/2012 | Maekawa et al. | |
| 8,232,196 B2 | 7/2012 | Yang et al. | |
| 8,648,472 B2 | 2/2014 | Isono | |
| 8,669,176 B1 | 3/2014 | Tanwar | |
| 8,952,535 B2 | 2/2015 | Haneda et al. | |

(Continued)

FOREIGN PATENT DOCUMENTS

| | | |
|---|---|---|
| KR | 10-0269878 B1 | 12/2000 |
| KR | 10-2005-0004671 A | 1/2005 |

(Continued)

*Primary Examiner* — Farun Lu
(74) *Attorney, Agent, or Firm* — Lee IP Law, P.C.

(57) ABSTRACT

A semiconductor device includes a substrate, a gate structure on the substrate, a source/drain pattern on the substrate, the source/drain pattern being at a side of the gate structure, a source/drain contact filling on and connected to the source/drain pattern, an entire top surface of the source/drain contact filling being lower than a top surface of the gate structure, and a connection contact directly on and connected to the source/drain contact filling, a top surface of the connection contact being higher than the top surface of the gate structure.

20 Claims, 23 Drawing Sheets

(56) References Cited

U.S. PATENT DOCUMENTS

| | | | |
|---|---|---|---|
| 9,935,051 B2 | 4/2018 | Adusumilli et al. | |
| 10,083,863 B1* | 9/2018 | Hsieh | H01L 21/32134 |
| 2009/0127711 A1 | 5/2009 | Bonilla et al. | |
| 2019/0148226 A1* | 5/2019 | Yim | H01L 23/5226 |
| | | | 257/383 |
| 2020/0006131 A1 | 1/2020 | Shimabukuro et al. | |
| 2020/0105577 A1* | 4/2020 | Liang | H01L 21/76843 |
| 2021/0335783 A1* | 10/2021 | Chiu | H01L 21/76897 |

FOREIGN PATENT DOCUMENTS

| | | |
|---|---|---|
| KR | 10-2009-0080281 A | 7/2009 |
| KR | 10-2010-0006646 A | 1/2010 |
| KR | 10-2010-0011067 A | 2/2010 |
| KR | 10-1830904 B1 | 2/2018 |
| KR | 10-2018-0087661 A | 8/2018 |

* cited by examiner

SEMICONDUCTOR DEVICE

CROSS-REFERENCE TO RELATED APPLICATION

Korean Patent Application No. 10-2020-0116578, filed on Sep. 11, 2020, in the Korean Intellectual Property Office, and entitled: "Semiconductor Device," is incorporated by reference herein in its entirety.

BACKGROUND

1. Field

The present disclosure relates to a semiconductor device.

2. Description of the Related Art

As one of the scaling techniques for increasing the density of semiconductor devices, a multi-gate transistor has been proposed, i.e., a transistor in which a fin-shaped or a nanowire-shaped multi-channel active pattern (or silicon body) is formed on a substrate, and a gate is formed on the surface of the multi-channel active pattern. Since the multi-gate transistor uses a three-dimensional (3D) channel, scaling of the multi-gate transistor can be easily achieved. Further, current control capability can be improved without increasing the gate length of the multi-gate transistor. In addition, a short channel effect (SCE) in which the potential of a channel region is affected by a drain voltage can be effectively suppressed.

SUMMARY

According to an embodiment of the present disclosure, there is provided a semiconductor device including a gate structure on a substrate, a source/drain pattern disposed on a side surface of the gate structure on the substrate, a source/drain contact filling connected to the source/drain pattern on the source/drain pattern, and a connection contact directly connected to the source/drain contact filling on the source/drain contact filling, wherein an entire top surface of the source/drain contact filling is lower than a top surface of the gate structure, and a top surface of the connection contact is higher than the top surface of the gate structure.

According to other embodiments of the present disclosure, there is provided a semiconductor device including a gate structure including a gate electrode and a gate capping pattern on the gate electrode on a substrate, a source/drain pattern disposed on a side surface of the gate structure on the substrate, a source/drain contact connected to the source/drain pattern on the source/drain pattern, and a connection contact directly connected to the source/drain contact on the source/drain contact, wherein the connection contact includes a connection contact filling and a connection contact barrier extending along a bottom surface of the connection contact filling, a top surface of the connection contact is higher than a top surface of the gate structure, and a bottom surface of the connection contact filling is lower than the top surface of the gate structure.

According to yet other embodiments of the present disclosure, there is provided a semiconductor device including a multi-channel active pattern on a substrate, a gate structure disposed on the multi-channel active pattern and including a gate electrode and a gate capping pattern, the gate capping pattern being disposed on the gate electrode, a source/drain pattern disposed on a side surface of the gate structure on the multi-channel active pattern, a source/drain contact connected to the source/drain pattern on the source/drain pattern, a connection contact directly connected to the source/drain contact on the source/drain contact, and a wiring structure connected to the connection contact on the connection contact, wherein the wiring structure includes a via directly connected to the connection contact and a wiring line connected to the via, the source/drain contact includes a source/drain contact barrier defining a filling recess, and a source/drain contact filling within a part of the filling recess, and an entire top surface of the source/drain contact filling is lower than a top surface of the gate capping pattern.

BRIEF DESCRIPTION OF THE DRAWINGS

Features will become apparent to those of skill in the art by describing in detail exemplary embodiments with reference to the attached drawings, in which.

DETAILED DESCRIPTION

Although the drawings relating to a semiconductor device according to some embodiments of the present disclosure illustratively show a fin-type transistor (FinFET) including a channel region having a fin-shaped pattern, or a transistor including nanowires or nanosheets, the present disclosure is not limited thereto, e.g., features of embodiments may be applied to a planar transistor or a transistors based on two-dimensional (2D) materials, i.e., 2D material based field effect transistor (FET), and heterostructures thereof.

Further, the semiconductor device according to some embodiments may include a tunneling FET or a three-dimensional (3D) transistor. The semiconductor device according to some embodiments may include a bipolar junction transistor, a lateral double diffusion metal oxide semiconductor (LDMOS) transistor, or the like.

A semiconductor device according to some embodiments will be described with reference to FIGS. 1 to 5.

Figure 1:
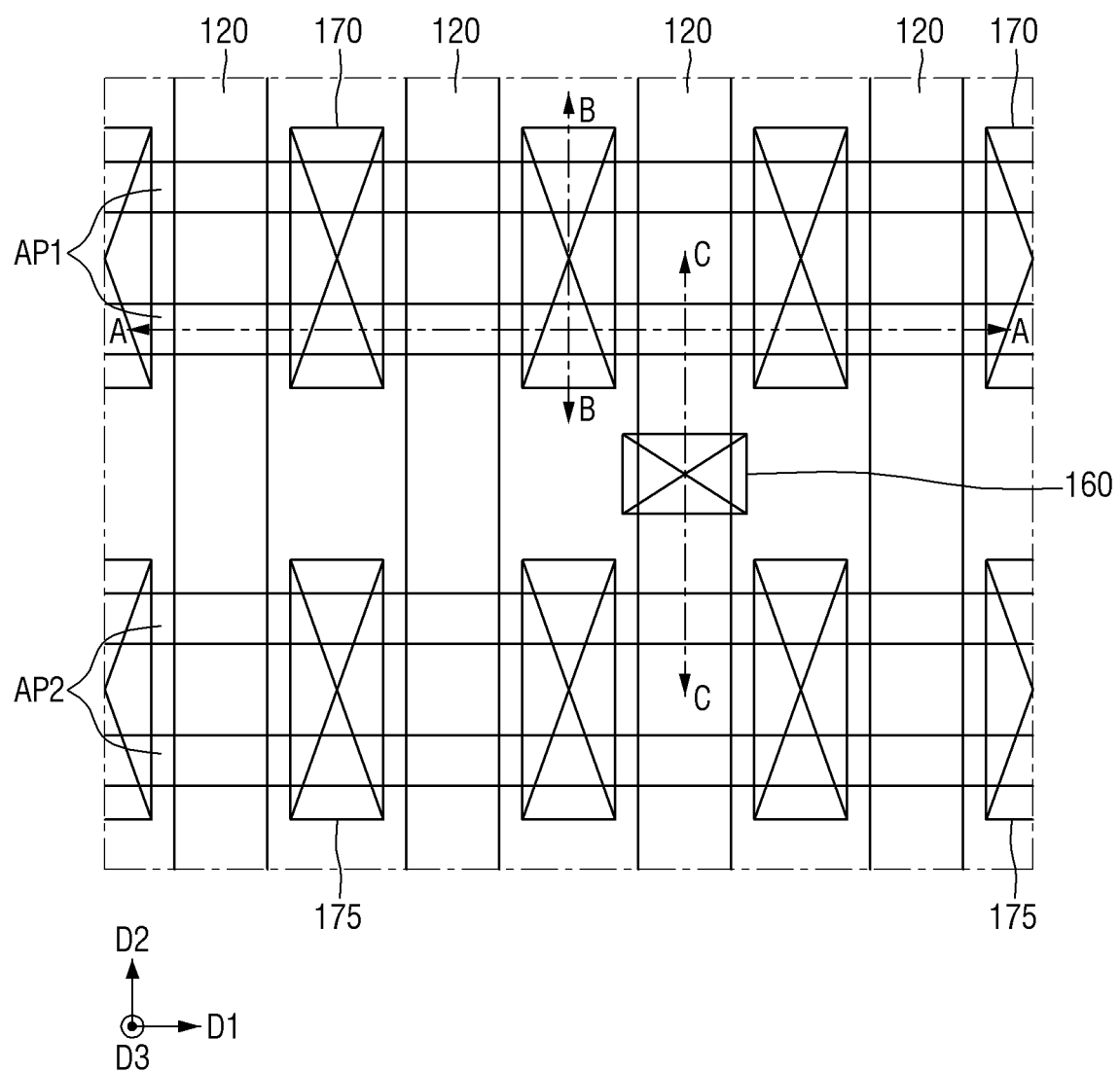
FIG. 1 is a layout diagram of a semiconductor device according to some embodiments.
Figure 2:
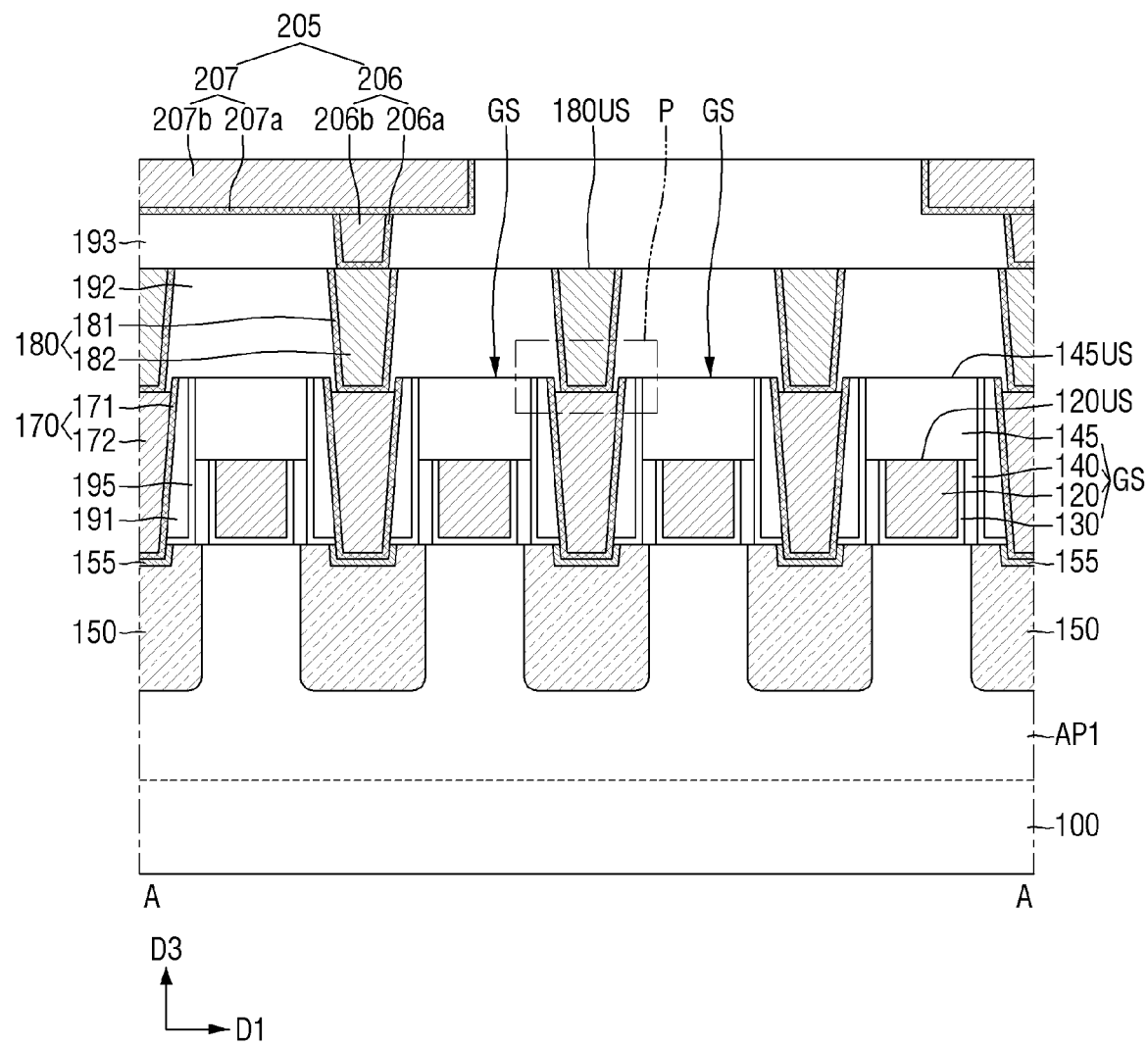
FIG. 2 is a cross-sectional view along line A-A of FIG. 1.
Figure 3:
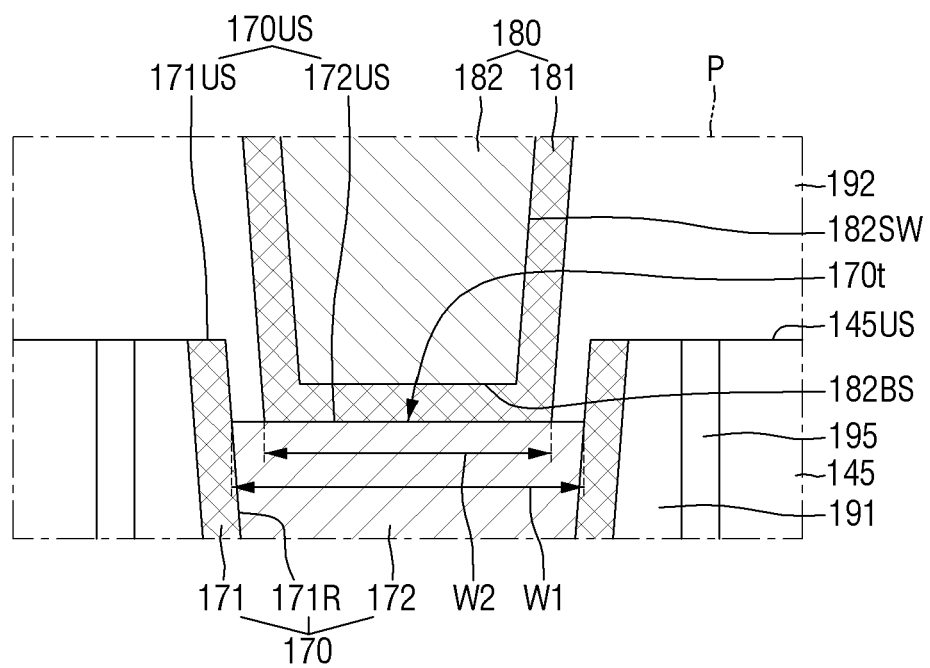
FIG. 3 is an enlarged view of portion P of FIG. 2.
Figure 4:
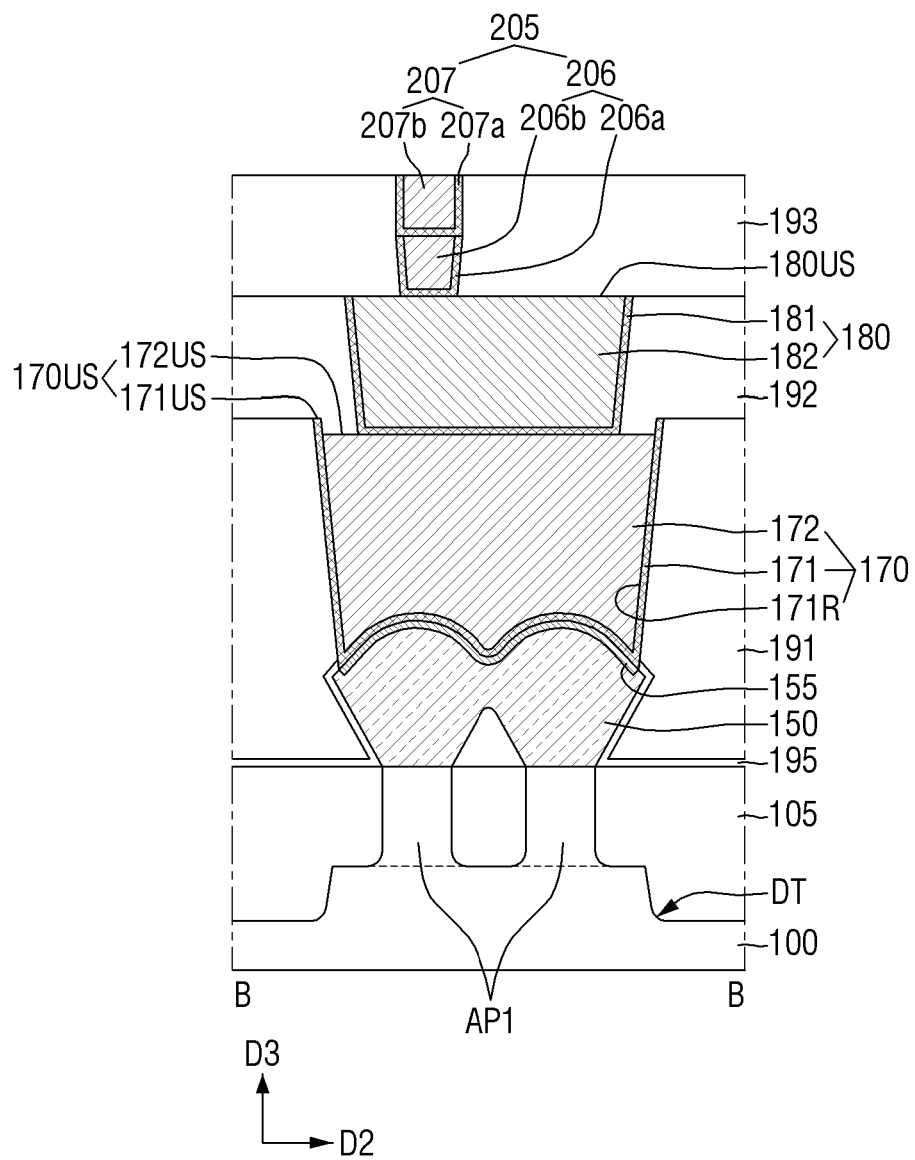
FIGS. 4 and 5 are cross-sectional views along lines B-B and C-C of FIG. 1.
Figure 5:
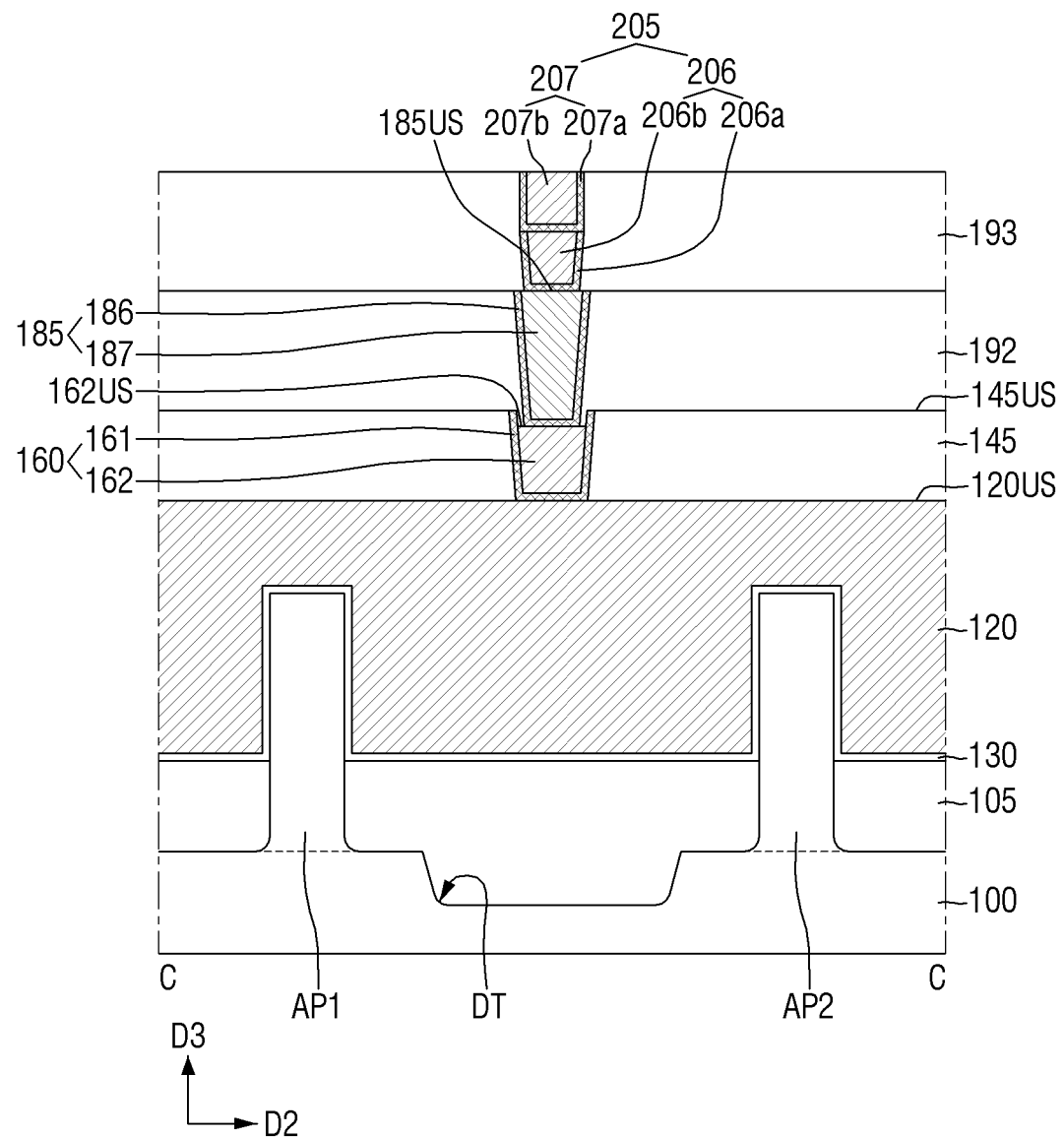

FIG. 1 is an exemplary layout diagram illustrating a semiconductor device according to some embodiments. FIG. 2 is a cross-sectional view taken along line A-A of FIG. 1. FIG. 3 is an enlarged view of portion P of FIG. 2. FIGS. 4 and 5 are cross-sectional views taken along lines B-B and C-C of FIG. 1, respectively. For simplicity of description, first and second connection contacts 180 and 185 and a wiring structure 205 are not illustrated in FIG. 1.

Referring to FIGS. 1 to 5, a semiconductor device according to some embodiments may include a first active pattern AP1, a second active pattern AP2, a gate electrode 120, a gate contact 160, a first source/drain contact 170, a second source/drain contact 175, a first connection contact 180, a second connection contact 185, and a wiring structure 205 on a substrate 100.

For example, the substrate 100 may be a bulk silicon or a silicon-on-insulator (SOI) substrate. In another example, the substrate 100 may be a silicon substrate, or may include other materials, e.g., silicon germanium, silicon germanium on insulator (SGOI), indium antimonide, a lead tellurium compound, indium arsenide, indium phosphide, gallium arsenide, or gallium antimonide, but is not limited thereto.

Each of the first active pattern AP1 and the second active pattern AP2 may protrude from the substrate 100. The first active pattern AP1 and the second active pattern AP2 may be elongated on the substrate 100, respectively, along a first direction D1. For example, the first active pattern AP1 and the second active pattern AP2 may each include a long side extending in the first direction D1 and a short side extending in a second direction D2. Here, the first direction D1 may intersect the second direction D2 and a third direction D3. Further, the second direction D2 may intersect the third direction D3.

The first active pattern AP1 may be disposed in an active region defined by a deep trench DT. The second active pattern AP2 may be disposed in an active region defined by the deep trench DT. The deep trench DT may be formed between the first active pattern AP1 and the second active pattern AP2, e.g., the first active pattern AP1 and the second active pattern AP2 may be spaced apart from each other along the second direction D2 by the deep trench DT.

In the semiconductor device according to some embodiments, the deep trench DT may distinguish an active region in which the first active pattern AP1 is disposed from an active region in which the second active pattern AP2 is disposed. For example, one of the first active pattern AP1 and the second active pattern AP2 may be disposed in a PMOS formation region, and the other of the first active pattern AP1 and the second active pattern AP2 may be disposed in an NMOS formation region. In another example, both the first active pattern AP1 and the second active pattern AP2 may be disposed in the PMOS formation region. In still another example, both the first active pattern AP1 and the second active pattern AP2 may be disposed in the NMOS formation region.

Each of the first active pattern AP1 and the second active pattern AP2 may be a multi-channel active pattern. In the semiconductor device according to some embodiments, each of the first active pattern AP1 and the second active pattern AP2 may be, e.g., a fin-shaped pattern. Each of the first active pattern AP1 and the second active pattern AP2 may be used as a channel pattern of a transistor.

Although each of the first active pattern AP1 and the second active pattern AP2 is shown to include two active patterns for simplicity of description, the present disclosure is not limited thereto. For example, each of the first and second active patterns AP1 and AP2 may be one active pattern or may be three or more active patterns.

Each of the first and second active patterns AP1 and AP2 may be a part of the substrate 100 or may include an epitaxial layer grown from the substrate 100. Each of the first and second active patterns AP1 and AP2 may include, e.g., silicon or germanium, which is an elemental semiconductor material. In addition, each of the first active pattern AP1 and the second active pattern AP2 may include a compound semiconductor, e.g., a group IV-IV compound semiconductor or a group III-V compound semiconductor.

For example, the group IV-IV compound semiconductor may be a binary compound or a ternary compound including at least two elements of, e.g., carbon (C), silicon (Si), germanium (Ge) and tin (Sn), or the above-mentioned compound doped with a group IV element. For example, the group III-V compound semiconductor may be a binary compound, a ternary compound or a quaternary compound formed by combining at least one of, e.g., aluminum (Al), gallium (Ga) and indium (In) which are group III elements, with one of, e.g., phosphorus (P), arsenic (As) and antimony (Sb) which are group V elements.

For example, the first active pattern AP1 and the second active pattern AP2 may include the same material. In another example, the first active pattern AP1 may include a material different from the second active pattern AP2.

A field insulating layer 105 may be formed on the substrate 100. The field insulating layer 105 may fill the deep trench DT. The field insulating layer 105 may be formed on a part of sidewalls of the first and second active patterns AP1 and AP2. Each of the first active pattern AP1 and the second active pattern AP2 may protrude above the top surface of the field insulating layer 105. The field insulating layer 105 may include, e.g., an oxide layer, a nitride layer, an oxynitride layer, or a combination layer thereof.

A gate structure GS may be disposed on the substrate 100. The gate structure GS may be elongated in the second direction D2. The gate structure GS may, e.g., continuously, intersect the first active pattern AP1 and the second active pattern AP2, respectively. The gate structure GS may include, e.g., the gate electrode 120, a gate insulating layer 130, a gate spacer 140, and a gate capping pattern 145.

Although the gate structure GS is illustrated as being disposed across the field insulating layer 105 filling the deep trench DT for simplicity of description, the present disclosure is not limited thereto. That is, at least one of the gate structures GS may be divided into two parts by the gate separation structure disposed on the field insulating layer 105.

The gate electrode 120 may be disposed on the substrate 100. The gate electrode 120 may be formed on the first active pattern AP1 and the second active pattern AP2. The gate electrode 120 may intersect the first and second active patterns AP1 and AP2.

The gate electrode 120 may surround the first and second active patterns AP1 and AP2 protruding from the top surface of the field insulating layer 105. The gate electrode 120 may extend in the second direction D2. The gate electrode 120 may include a long side extending in the second direction D2 and a short side extending in the first direction D1.

The gate electrode 120 may include, e.g., at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof.

The gate spacer 140 may be disposed on the sidewall of the gate electrode 120. The gate spacer 140 may extend in the second direction D2. The gate spacer 140 may include, e.g., at least one of silicon nitride (SiN), silicon oxynitride (SiON), silicon oxide (SiO2), silicon oxynitride (SiOCN), silicon boron nitride (SiBN), silicon oxyboron nitride (SiOBN), silicon oxycarbide (SiOC) or a combination thereof.

The gate insulating layer 130 may extend along the sidewall and the bottom surface of the gate electrode 120. The gate insulating layer 130 may be disposed between the gate electrode 120 and the first active pattern AP1, between the gate electrode 120 and the second active pattern AP2, and between the gate electrode 120 and the field insulating layer 105. The gate insulating layer 130 may be disposed between the gate electrode 120 and the gate spacer 140.

The gate insulating layer 130 may include, e.g., silicon oxide, silicon oxynitride, silicon nitride, or a high-k material having a higher dielectric constant than silicon oxide. The high-k material may include, e.g., at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device according to some embodiments may include a negative capacitor (NC) FET using a negative capacitor (NC). For example, the gate insulating layer 130 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor. On the other hand, when at least one of the capacitances of two or more capacitors connected in series has a negative value, the total capacitance may have a positive value and may be greater than the absolute value of each capacitance.

When a ferroelectric material layer having a negative capacitance and a paraelectric material layer having a positive capacitance are connected in series, the total capacitance value of the ferroelectric material layer and the paraelectric material layer connected in series may increase. By using the principle that the total capacitance value is increased, the transistor containing the ferroelectric material layer may have a subthreshold swing (SS) lower than or equal to a threshold voltage lower than 60 mV/decade at room temperature.

The ferroelectric material layer may have ferroelectric properties. The ferroelectric material layer may include, e.g., at least one of hafnium oxide, hafnium zirconium oxide, barium strontium titanium oxide, barium titanium oxide, or lead zirconium titanium oxide. In this case, as one example, the hafnium zirconium oxide may be a material containing hafnium oxide doped with zirconium (Zr). As another example, the hafnium zirconium oxide may be a compound of hafnium (Hf), zirconium (Zr), and oxygen (O).

The ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

When the ferroelectric material layer includes hafnium oxide, the dopant included in the ferroelectric material layer may include, e.g., at least one of gadolinium (Gd), silicon (Si), zirconium (Zr), aluminum (Al), or yttrium (Y).

When the dopant is aluminum (Al), the ferroelectric material layer may include 3 to 8 atomic percent (at %) of aluminum. In this case, the ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include, e.g., at least one of silicon oxide or metal oxide having a high dielectric constant. The metal oxide included in the paraelectric material layer may include, e.g., at least one of hafnium oxide, zirconium oxide, or aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer is different from the crystal structure of the hafnium oxide included in the paraelectric material layer.

The ferroelectric material layer may have a thickness that exhibits ferroelectric properties. The thickness of the ferroelectric material layer may be, e.g., in a range of 0.5 to 10 nm, but is not limited thereto. Since a critical thickness at which each ferroelectric material exhibits ferroelectric properties may be different, the thickness of the ferroelectric material layer may vary depending on the ferroelectric material.

In one example, the gate insulating layer 130 may include one ferroelectric material layer. In another example, the gate insulating layer 130 may include a plurality of ferroelectric material layers spaced apart from each other. The gate insulating layer 130 may have a laminated layer structure in which a plurality of ferroelectric material layers and a plurality of paraelectric material layers are alternately laminated.

The gate capping pattern 145 may be disposed on the top surface of the gate electrode 120 and the top surface of the gate spacer 140. A top surface 145US of the gate capping pattern 145 may be the top surface of the gate structure GS.

The gate capping pattern 145 may include, e.g., at least one of silicon nitride (SiN), silicon oxynitride (SiON), silicon oxide (SiO$_2$), silicon carbonitride (SiCN), silicon oxycarbonitride (SiOCN), or a combination thereof.

Unlike the illustrated example, the gate capping pattern 145 may be disposed between the gate spacers 140. In this case, the top surface of the gate capping pattern 145 may lie on the same plane as the top surface of the gate spacer 140.

A source/drain pattern 150 may be formed on the first active pattern AP1. The source/drain pattern 150 may be positioned on the substrate 100. The source/drain pattern 150 may be disposed on the side surface of the gate structure GS. The source/drain pattern 150 may be disposed between the gate structures GS.

For example, the source/drain patterns 150 may be disposed on both sides of the gate structure GS. In another example, the source/drain pattern 150 may be disposed on one side of the gate structure GS and may not be disposed on the other side of the gate structure GS.

The source/drain pattern 150 may include an epitaxial pattern. The source/drain pattern 150 may be included in a source/drain of a transistor using the first active pattern AP1 as a channel region.

The source/drain pattern 150 may be connected to a channel pattern portion used as a channel among the first active patterns AP1. The source/drain pattern 150 is illustrated as merging of two epitaxial patterns formed on the respective first active patterns AP1. However, this is merely for simplicity of description and the present disclosure is not limited thereto. That is, epitaxial patterns formed on the respective first active patterns AP1 may be separated from each other.

For example, an air gap may be disposed in a space between the source/drain patterns 150 combined with the field insulating layer 105. As another example, an insulating material may be filled in a space between the source/drain patterns 150 combined with the field insulating layer 105.

A source/drain pattern as described above may be disposed on the second active pattern AP2 between the gate structures GS.

An etch stop layer 195 may be disposed on the top surface of the field insulating layer 105, the sidewall of the gate structure GS, and the source/drain pattern 150. The etch stop layer 195 may contain a material having an etching selectivity with respect to a first interlayer insulating layer 191 to be described later. The etch stop layer 195 may include, e.g., at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), or a combination thereof.

The first interlayer insulating layer 191 may be formed on the field insulating layer 105. The first interlayer insulating layer 191 may be disposed on the source/drain pattern 150. The first interlayer insulating layer 191 does not cover the top surface of the gate structure GS. That is, the first interlayer insulating layer 191 does not cover the top surface 145US of the gate capping pattern.

The first interlayer insulating layer 191 may include, e.g., at least one of silicon oxide, silicon nitride, silicon oxynitride, or a low-k material. The low-k material may include, e.g., fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), Tonen Silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but is not limited thereto.

The first source/drain contact 170 may be disposed on the first active pattern AP1. The second source/drain contact 175 may be disposed on the second active pattern AP2.

For example, at least a part of the first source/drain contact 170 may be directly connected to the second source/drain contact 175 corresponding in the second direction D2. In other words, the first source/drain contact 170 may be disposed not only on the first active pattern AP1 but also on the second active pattern AP2.

Since matters related to the second source/drain contact 175 are substantially the same as those related to the first source/drain contact 170, the following description will be made using the first source/drain contact 170 on the first active pattern AP1.

The first source/drain contact 170 may be connected to the source/drain pattern 150. The first source/drain contact 170 may be disposed on the source/drain pattern 150.

The first source/drain contact 170 may be disposed in the first interlayer insulating layer 191. The first source/drain contact 170 may be surrounded by the first interlayer insulating layer 191. The first source/drain contact 170 may penetrate the etch stop layer 195 to be connected to the source/drain pattern 150.

Although it is illustrated that the first source/drain contact 170 does not contact the sidewall of the gate structure GS, the present disclosure is not limited thereto. For example, the first source/drain contact 170 may contact at least one of sidewalls of the adjacent gate structure GS facing each other in the first direction D1.

A contact silicide layer 155 may be formed between the first source/drain contact 170 and the source/drain pattern 150. For example, as illustrated in FIG. 4, the contact silicide layer 155 may be formed along a profile of an interface between the source/drain pattern 150 and the first source/drain contact 170. In another example, the contact silicide layer 155 may be formed along a profile of the source/drain pattern 150 that does not form a boundary with the first source/drain contact 170. The contact silicide layer 155 may include, e.g., a metal silicide material.

The first source/drain contact 170 may extend on the source/drain pattern 150 in the third direction D3. The first source/drain contact 170 does not protrude above the top surface 145US of the gate structure. In other words, a top surface 170US of the first source/drain contact 170 may be lower than or at the same level as the top surface 145US of the gate structure, as illustrated in FIG. 3.

The first source/drain contact 170 may include a source/drain contact barrier 171 and a source/drain contact filling 172. The source/drain contact filling 172 may be disposed on the source/drain contact barrier 171. The source/drain contact barrier 171 and the source/drain contact filling 172 may be connected to the source/drain pattern 150.

The source/drain contact barrier 171 may extend, e.g., conformally, along a sidewall and a bottom surface of the source/drain contact filling 172. The source/drain contact barrier 171 may define a filling recess 171R. The source/drain contact filling 172 may fill at least a part of the filling recess 171R. In the semiconductor device according to some embodiments, the source/drain contact filling 172 may fill a part of the filling recess 171R.

The top surface 170US of the first source/drain contact may include a top surface 171US of the source/drain contact barrier 171 and a top surface 172US of the source/drain contact filling 172. The top surface 171US of the source/drain contact barrier 171 may be the topmost surface of the source/drain contact barrier 171. With respect to the top surface of the first active pattern AP1, the top surface 171US of the source/drain contact barrier 171 may be higher than the top surface 172US of the source/drain contact filling 172.

For example, the top surface 171US of the source/drain contact barrier 171 may protrude in the third direction D3 from, e.g., above, the top surface 172US of the source/drain contact filling 172. With respect to the top surface of the first active pattern AP1, a part of the source/drain contact barrier 171 may protrude above the top surface 172US of the source/drain contact filling.

The top surface 171US of the source/drain contact barrier 171 and the top surface 172US of the source/drain contact filling 172 may be connected by the filling recess 171R defined by a part of the source/drain contact barrier 171 protruding above the top surface 172US of the source/drain contact filling 172.

In the semiconductor device according to some embodiments, the first source/drain contact 170 may include the top surface 172US of the source/drain contact filling 172, and a contact trench 170t defined by the source/drain contact barrier 171 protruding above the top surface 172US of the source/drain contact filling 172. In other words, a bottom of the contact trench 170t may be the top surface 172US of the source/drain contact filling 172, and sidewalls of the contact trench 170t may be the source/drain contact barrier 171 protruding above the top surface 172US of the source/drain contact filling 172.

For example, with respect to the top surface of the first active pattern AP1, the entire top surface 172US of the source/drain contact filling 172 is lower than the top surface 145US of the gate structure GS, i.e., the entire top surface 172US of the source/drain contact filling 172 is lower than the top surface 145US of the gate capping pattern 145. The entire top surface 172US of the source/drain contact filling 172 is closer to the top surface of the first active pattern AP1 than the top surface 145US of the gate capping pattern 145 is, i.e., a distance between the top surface 172US of the source/drain contact filling 172 and the top surface of the first active pattern AP1 is smaller than a distance between the top surface 145US of the gate capping pattern 145 and the top surface of the first active pattern AP1.

With respect to the top surface of the first active pattern AP1, the top surface 172US of the source/drain contact filling 172 may be higher than a top surface 120US of the gate electrode 120, e.g., relative to the top surface of the first active pattern AP1. The top surface 120US of the gate electrode 120 is closer to the top surface of the first active pattern AP1 than the top surface 172US of the source/drain contact filling 172 is.

In the semiconductor device according to some embodiments, the top surface 171US of the source/drain contact barrier 171 may lie on the same plane as the top surface 145US of the gate structure GS. For example, the top surface 171US of the source/drain contact barrier 171 may be level, e.g., coplanar, with the top surface 145US of the gate structure GS.

Since the entire top surface 172US of the source/drain contact filling 172 is lower than the top surface 145US of the gate structure GS, the volume of the source/drain contact filling 172 may be reduced. By reducing the volume of the source/drain contact filling 172, the capacitance of a parasitic capacitor between the source/drain contact filling 172 and the gate electrode 120 may be reduced.

Also, since the entire top surface 172US of the source/drain contact filling 172 is lower than the top surface 145US of the gate structure GS, the length of the current path between the source/drain pattern 150 and the wiring structure 205 may be reduced. Accordingly, the resistance between the source/drain pattern 150 and the wiring structure 205 may be reduced.

The gate contact 160 may be disposed on the gate electrode 120. The gate contact 160 may penetrate the gate capping pattern 145 to be connected to the gate electrode 120. For example, the gate contact 160 may be surrounded by the gate capping pattern 145.

The gate contact 160 is illustrated as being disposed on the field insulating layer 105 filling the deep trench DT, e.g., the gate electrode 120 may be between the gate contact 160 and the field insulating layer 105, but the present disclosure is not limited thereto. Although one gate contact 160 is illustrated for simplicity of description, the present disclosure is not limited thereto.

The gate contact 160 may include a gate contact barrier 161 and a gate contact filling 162. The gate contact filling 162 may be disposed on the gate contact barrier 161.

In the semiconductor device according to some embodiments, with respect to the top surface of the first active pattern AP1, a part of the gate contact barrier 161 may protrude above a top surface 162US of the gate contact filling 162. For example, with respect to the top surface of the first active pattern AP1, the top surface 162US of the gate contact filling 162 is lower than the top surface 145US of the gate capping pattern 145.

For example, the gate contact barrier 161 may be disposed, e.g., conformally, along the sidewall and the bottom surface of the gate contact filling 162. In another example, the gate contact barrier 161 may extend, e.g., conformally, along the sidewall of the gate contact filling 162, but may not be disposed on the bottom surface of the gate contact barrier 161.

Each of the gate contact barrier 161 and the source/drain contact barrier 171 may include at least one of, e.g., tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material. In the semiconductor device according to some embodiments, the 2D material may be a metallic material and/or a semiconductor material. The 2D material may include a 2D allotrope or a 2D compound. For example, it may include at least one of graphene, molybdenum disulfide ($MoS_2$), molybdenum diselenide ($MoSe_2$), tungsten diselenide ($WSe_2$), or tungsten disulfide ($WS_2$), but is not limited thereto. That is, since the above-mentioned 2D materials are merely examples, the 2D materials that may be included in the semiconductor device of the present disclosure are not limited thereto.

Each of the gate contact filling 162 and the source/drain contact filling 172 may include, e.g., at least one of aluminum (Al), tungsten (W), cobalt (Co), copper (Cu), ruthenium (Ru), silver (Ag), gold (Au), manganese (Mn), or molybdenum (Mo).

A second interlayer insulating layer 192 may be disposed on the first source/drain contact 170, the second source/drain contact 175, and the gate contact 160. The second interlayer insulating layer 192 may be disposed on the first interlayer insulating layer 191. The second interlayer insulating layer 192 may include, e.g., at least one of silicon oxide, silicon nitride, silicon oxynitride, or a low-k material.

The first connection contact 180 may be disposed on the first source/drain contact 170. The first connection contact 180 may be disposed on the source/drain contact filling 172.

The first connection contact 180 may be connected to the first source/drain contact 170. The first connection contact 180 may be directly connected to the first source/drain contact 170. The first connection contact 180 may also be disposed on the second source/drain contact 175.

For example, the first connection contact 180 may be disposed on each first source/drain contact 170. In another example, the first connection contact 180 may be disposed on, e.g., only, a part of the first source/drain contact 170.

The first connection contact 180 may be disposed in the second interlayer insulating layer 192. The first connection contact 180 may be surrounded by the second interlayer insulating layer 192.

Since the first connection contact 180 is directly connected to the first source/drain contact 170, the bottom surface of the first connection contact 180 is lower than the top surface 145US of the gate structure GS. That is, with respect to the top surface of the first active pattern AP1, the bottom surface of the first connection contact 180 is closer to the substrate 100 than the top surface 145US of the gate structure is.

In the semiconductor device according to some embodiments, the entire bottom surface of the first connection contact 180 may overlap the top surface 172US of the source/drain contact filling in the third direction D3. In other words, a part of the first connection contact 180 may be disposed in the contact trench 170t.

For example, at the boundary between the first connection contact 180 and the source/drain contact filling 172, a width W2 of the first connection contact 180 in the direction D1 may be smaller than or equal to a width W1 of the first source/drain contact filling 172 in the first direction D1, e.g., the first connection contact 180 may be centered on the first source/drain contact 170.

With respect to the top surface of the first active pattern AP1, a top surface 180US of the first connection contact 180 is higher than the top surface 145US of the gate structure GS. The top surface 180US of the first connection contact 180 protrudes above the top surface 145US of the gate capping pattern 145. The second interlayer insulating layer 192 does not cover the top surface 180US of the first connection contact 180.

The first connection contact 180 may include a first connection contact barrier 181 and a first connection contact filling 182. The first connection contact filling 182 may be disposed on the first connection contact barrier 181.

The first connection contact barrier 181 may extend, e.g., conformally, along a sidewall 182SW of the first connection contact filling 182 and a bottom surface 182BS of the first connection contact filling 182. A part of the first connection contact barrier 181 may be disposed in the contact trench 170t.

In the semiconductor device according to some embodiments, with respect to the top surface of the first active pattern AP1, the bottom surface 182BS of the first connection contact filling 182 may be lower than the top surface 145US of the gate structure GS. That is, the bottom surface 182BS of the first connection contact filling 182 may be lower than the top surface 145US of the gate capping pattern 145. In the semiconductor device according to some embodiments, with respect to the top surface of the first active pattern AP1, the bottom surface 182BS of the first connection contact filling 182 may be lower than the top surface 171US, i.e., topmost surface, of the source/drain contact barrier 171.

The second connection contact 185 may be disposed on the gate contact 160. The second connection contact 185 may be connected to the gate contact 160. The second connection contact 185 may be directly connected to the gate contact 160.

The first connection contact 180 may be disposed in the second interlayer insulating layer 192. Since the second connection contact 185 is directly connected to the gate contact 160, the bottom surface of the second connection contact 185 may be lower than the top surface 145US of the gate structure. With respect to the top surface of the first active pattern AP1, a top surface 185US of the second connection contact 185 is higher than the top surface 145US of the gate structure GS.

The second connection contact 185 may include a second connection contact barrier 186 and a second connection contact filling 187. The second connection contact filling 187 may be disposed on the second connection contact barrier 186. The second connection contact barrier 186 may extend, e.g., conformally, along the sidewall of the second connection contact filling 187 and the bottom surface of the second connection contact filling 187.

Each of the first connection contact barrier 181 and the second connection contact barrier 186 may include at least one of, e.g., tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material. Each of the first connection contact filling 182 and the second connection contact filling 187 may include, for example, at least one of aluminum (Al), tungsten (W), cobalt (Co), copper (Cu), ruthenium (Ru), silver (Ag), gold (Au), manganese (Mn), or molybdenum (Mo).

A third interlayer insulating layer 193 may be disposed on the first connection contact 180 and the second connection contact 185. The third interlayer insulating layer 193 may be disposed on the second interlayer insulating layer 192. The third interlayer insulating layer 193 may include, e.g., at least one of silicon oxide, silicon nitride, silicon oxynitride, or a low-k material.

The wiring structure 205 may be disposed on the first connection contact 180 and the second connection contact 185. The wiring structure 205 may be connected to the first connection contact 180 and the second connection contact 185. The wiring structure 205 may be disposed in the third interlayer insulating layer 193.

The wiring structure 205 may include a via 206 directly connected to the first connection contact 180 and the second connection contact 185, and a wiring line 207 connected to the via 206.

The via 206 may include a via barrier layer 206a and a via filling layer 206b. The wiring line 207 may include a wiring barrier layer 207a and a wiring filling layer 207b. The wiring filling layer 207b and the via filling layer 206b may be separated by the wiring barrier layer 207a.

Each of the via barrier layer 206a and the wiring barrier layer 207a may include at least one of, e.g., tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material. Each of the via filling layer 206b and the wiring filling layer 207b may include, for example, at least one of aluminum (Al), tungsten (W), cobalt (Co), copper (Cu), ruthenium (Ru), silver (Ag), gold (Au), manganese (Mn), or molybdenum (Mo).

Figure 6:
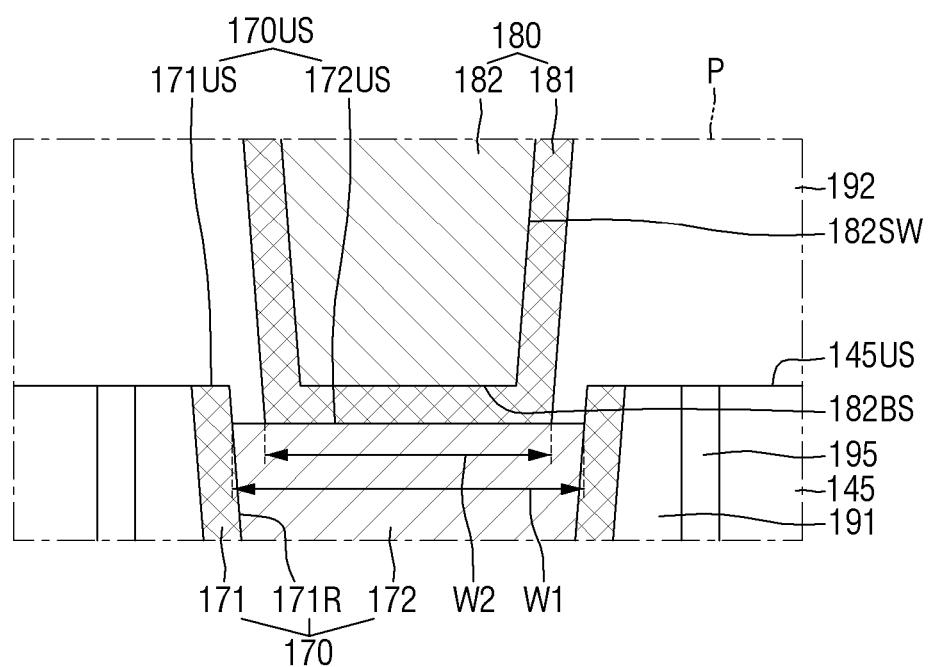
FIG. 6 is a diagram of a semiconductor device according to some embodiments.
Figure 7:
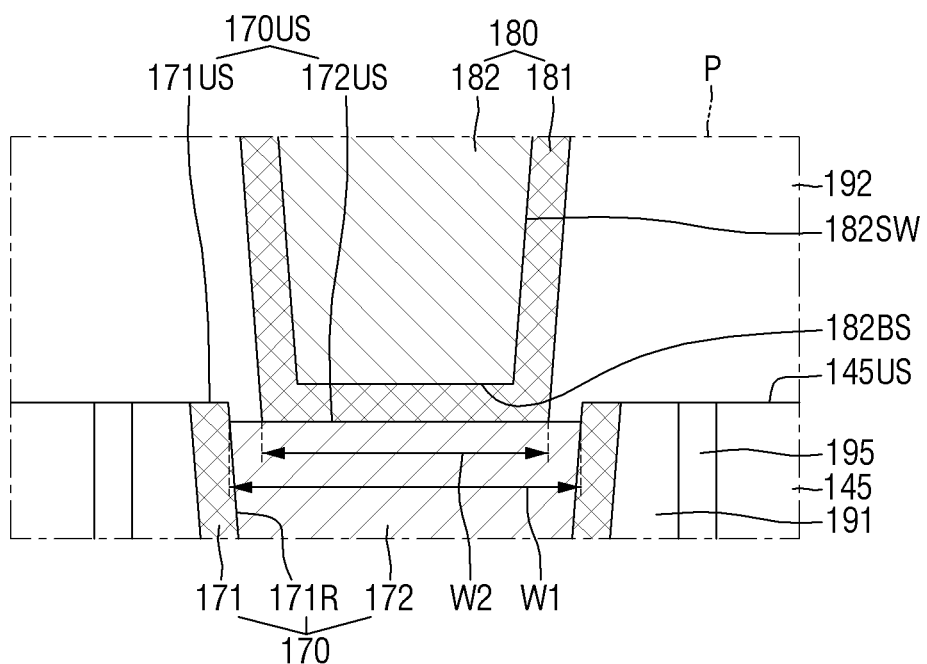
FIG. 7 is a diagram of a semiconductor device according to some embodiments.
Figure 8:
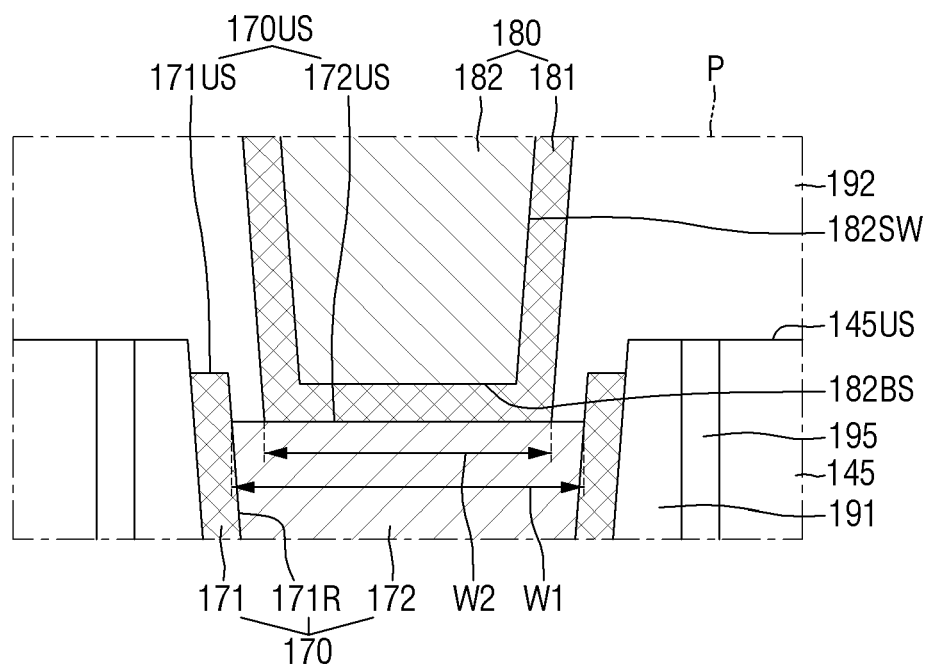
FIG. 8 is a diagram of a semiconductor device according to some embodiments.

FIGS. 6 to 8g are diagrams illustrating semiconductor device according to some embodiments. FIGS. 6 to 8 are enlarged views of portion P of FIG. 2, respectively. For simplicity of description, the following description will focus on differences relative to the description with reference to FIGS. 1 to 5.

Referring to FIG. 6, in the semiconductor device according to some embodiments, with respect to the top surface of the first active pattern AP1, the bottom surface 182BS of the first connection contact filling 182 may be located at the same height as the top surface 145US of the gate structure GS. That is, the bottom surface 182BS of the first connection contact filling 182 may be on the same plane as the top surface 145US of the gate capping pattern 145. Also, the bottom surface 182BS of the first connection contact filling 182 may be located at the same height as the top surface 171US of the source/drain contact barrier 171.

Referring to FIG. 7, in the semiconductor device according to some embodiments, with respect to the top surface of the first active pattern AP1, the bottom surface 182BS of the first connection contact filling 182 may be higher than the top surface 145US of the gate structure GS. That is, the bottom surface 182BS of the first connection contact filling 182 may protrude above the top surface 145US of the gate capping pattern 145, e.g., may extend above and out of the contact trench. Also, the bottom surface 182BS of the first connection contact filling 182 may be higher than the top surface 171US of the source/drain contact barrier 171.

Referring to FIG. 8, in the semiconductor device according to some embodiments, with respect to the top surface of the first active pattern AP1, the top surface 171US of the source/drain contact barrier 171 may be lower than the top surface 145US of the gate structure GS. With respect to the top surface 145US of the gate structure, the top surface 172US of the source/drain contact filling 172 is disposed at a position lower than the top surface 171US of the source/drain contact barrier 171. With respect to the top surface of the first active pattern AP1, the entire top surface 170US of the first source/drain contact 170 is lower than the top surface 145US of the gate structure GS.

As one example, the bottom surface 182BS of the first connection contact filling 182 may be higher than the top surface 171US of the source/drain contact barrier 171. As another example, the bottom surface 182BS of the first connection contact filling 182 may be lower than the top surface 171US of the source/drain contact barrier 171. As still another example, the bottom surface 182BS of the first connection contact filling 182 may be located at the same height as the top surface 171US of the source/drain contact barrier 171.

Figure 9:
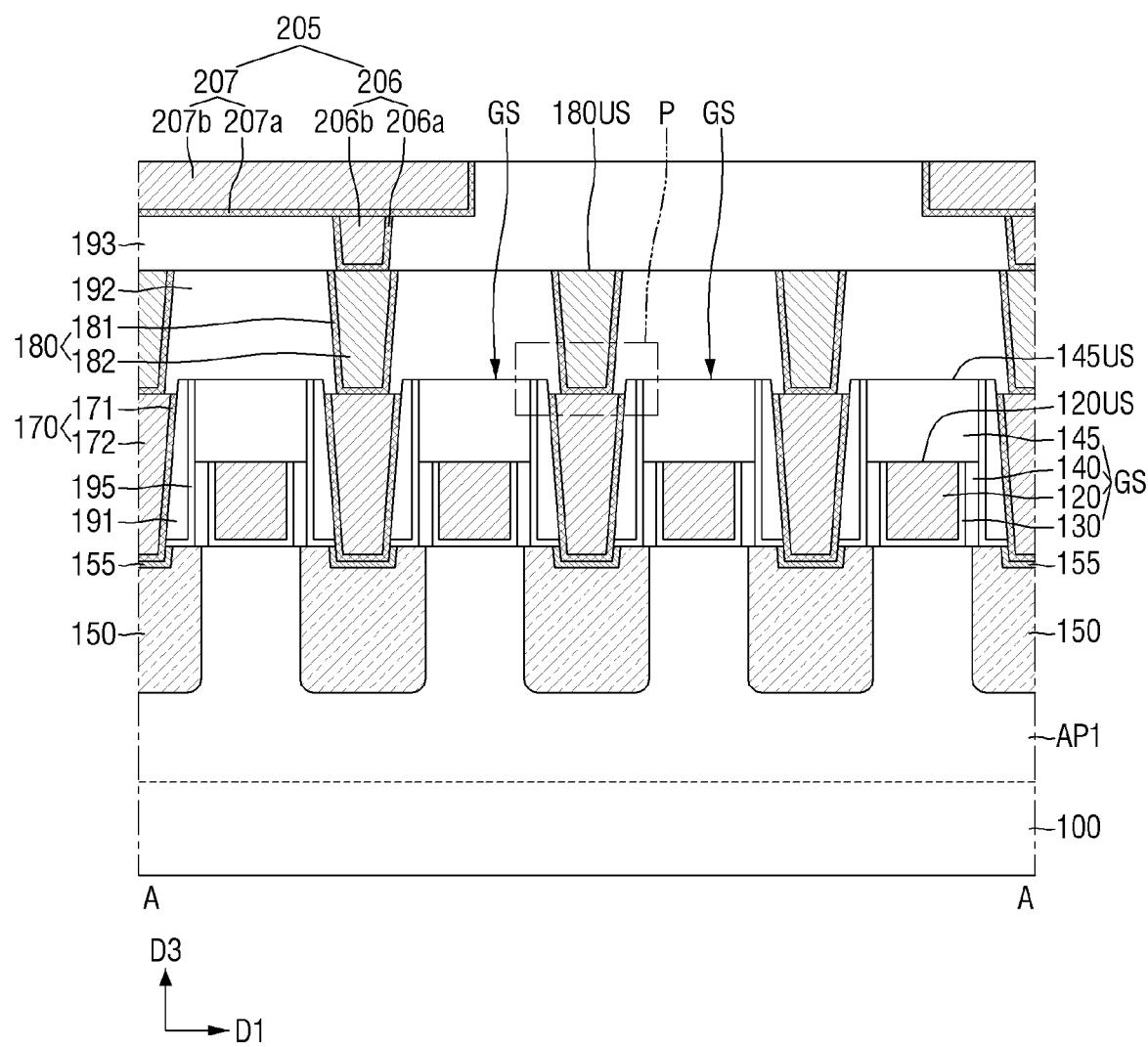
FIG. 9 is a diagram of a semiconductor device according to some embodiments.
Figure 10:
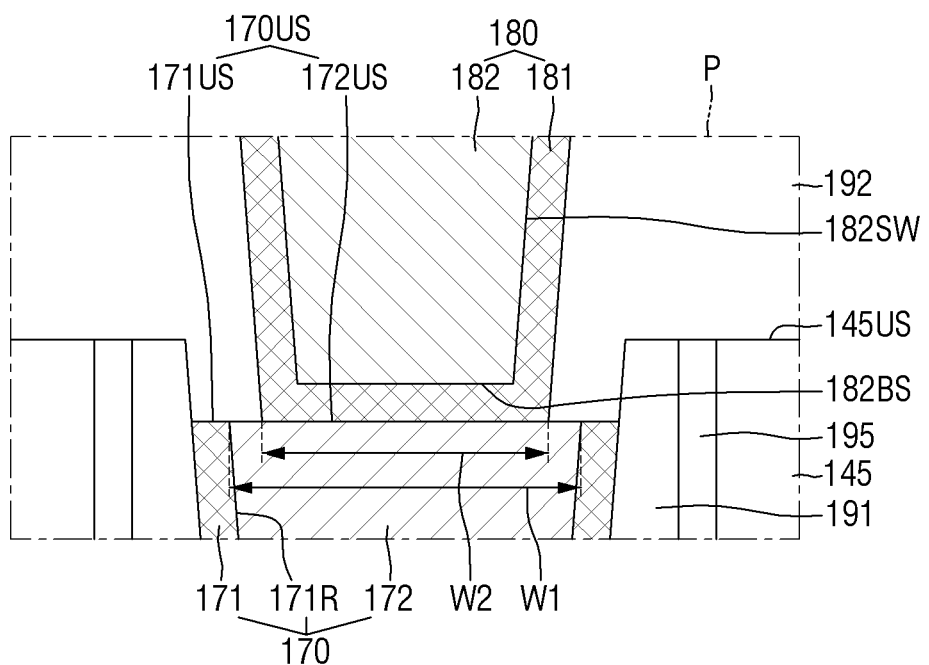
FIG. 10 is an enlarged view of portion P of FIG. 9.

FIG. 9 is a diagram illustrating a semiconductor device according to some embodiments. FIG. 10 is an enlarged view of portion P of FIG. 9. For simplicity of description, the following description will focus on differences relative to the description with reference to FIGS. 1 to 5.

Referring to FIGS. 9 and 10, in the semiconductor device according to some embodiments, with respect to the top surface of the first active pattern AP1, the top surface 171US of the source/drain contact barrier 171 may be located at the same height as the top surface 172US of the source/drain contact filling 172. In other words, the source/drain contact barrier 171 does not include a portion protruding above the top surface 172US of the source/drain contact filling 172.

For example, with respect to the top surface of the first active pattern AP1, the entire top surface 170US of the first source/drain contact 170 is lower than the top surface 145US of the gate structure GS, e.g., to define a contact trench. In another example, with respect to the top surface of the first active pattern AP1, the top surface 171US of the source/drain contact barrier 171 may be lower than the top surface 172US of the source/drain contact filling 172.

Figure 11:
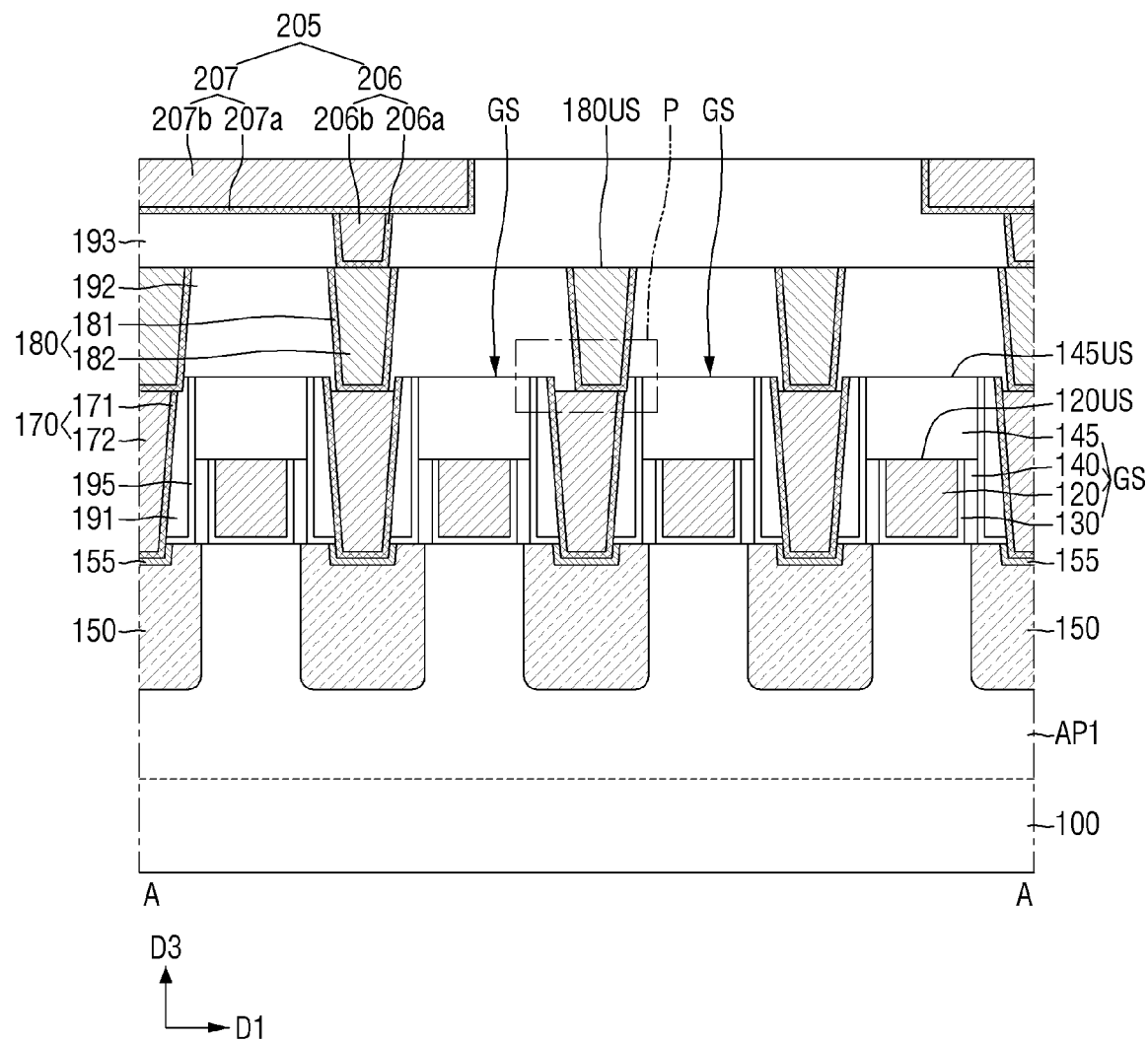
FIG. 11 is a diagram of a semiconductor device according to some embodiments.
Figure 12:
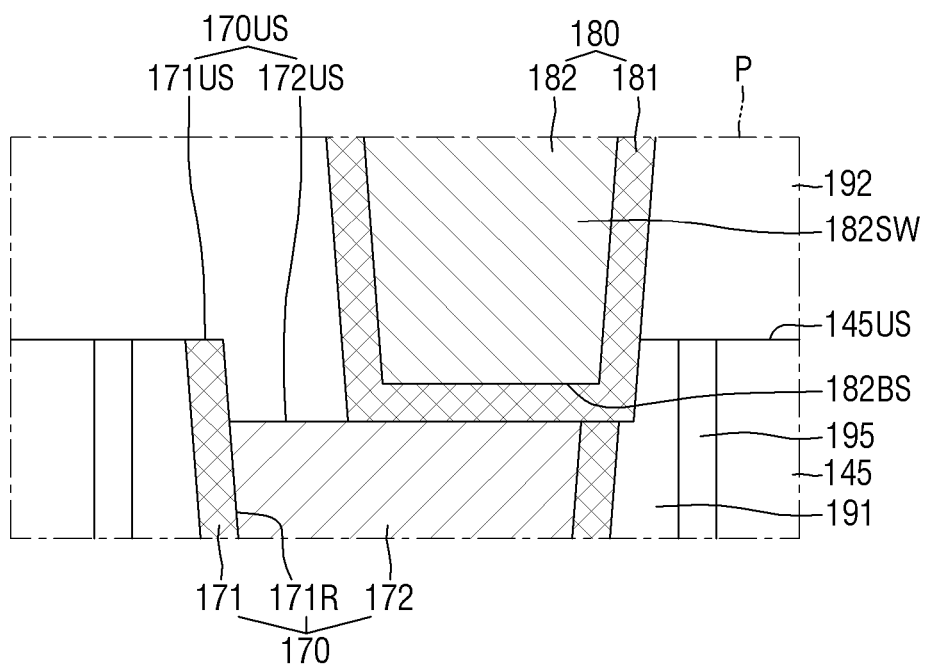
FIG. 12 is an enlarged view of portion P of FIG. 11.

FIG. 11 is a diagram illustrating a semiconductor device according to some embodiments. FIG. 12 is an enlarged view of portion P of FIG. 11. For simplicity of description, the following description will focus on differences relative to the description with reference to FIGS. 1 to 5.

Referring to FIGS. 11 and 12, in the semiconductor device according to some embodiments, a part of the bottom surface of the first connection contact 180 may overlap the top surface 172US of the source/drain contact filling 172 in the third direction D3. In other words, the first connection contact 180 may be misaligned with the source/drain contact filling 172 in the third direction D3.

Although it is illustrated that a part of the first connection contact 180 is misaligned with the source/drain contact filling 172 in the third direction D3, and the remaining part of the first connection contact 180 is aligned with the source/drain contact filling 172 in the third direction D3, it is only for simplicity of description and the present disclosure is not limited thereto.

Figure 13:
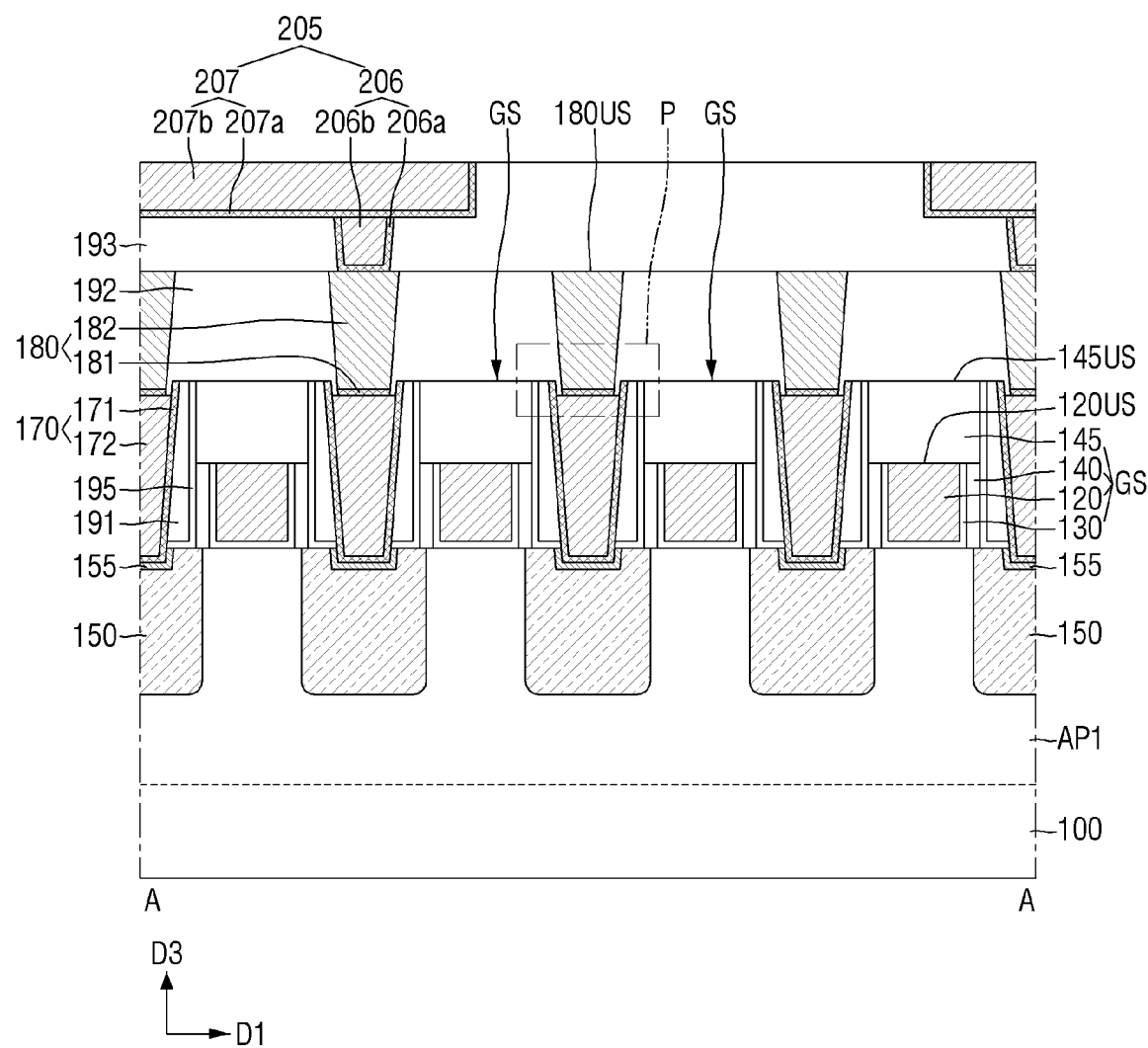
FIG. 13 is a diagram of a semiconductor device according to some embodiments.
Figure 14:
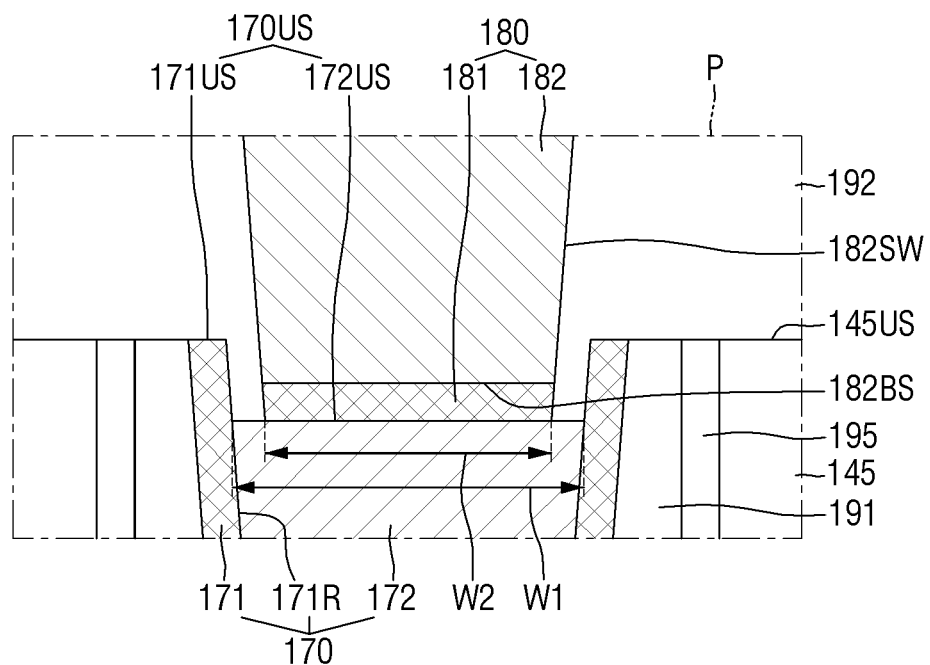
FIG. 14 is an enlarged view of portion P of FIG. 13.

FIG. 13 is a diagram illustrating a semiconductor device according to some embodiments. FIG. 14 is an enlarged view of portion P of FIG. 13. For simplicity of description, the following description will focus on differences from the description with reference to FIGS. 1 to 5.

Referring to FIGS. 13 and 14, in the semiconductor device according to some embodiments, the first connection contact barrier 181 may not be disposed on the sidewall 182SW of the first connection contact filling. In other words, the first connection contact barrier 181 extends along the bottom surface 182BS of the first connection contact filling, but the first connection contact barrier 181 does not extend along the sidewall 182SW of the first connection contact filling 182.

The second connection contact (185 in FIG. 5) may also have a structure similar to that of the first connection contact 180.

Figure 15:
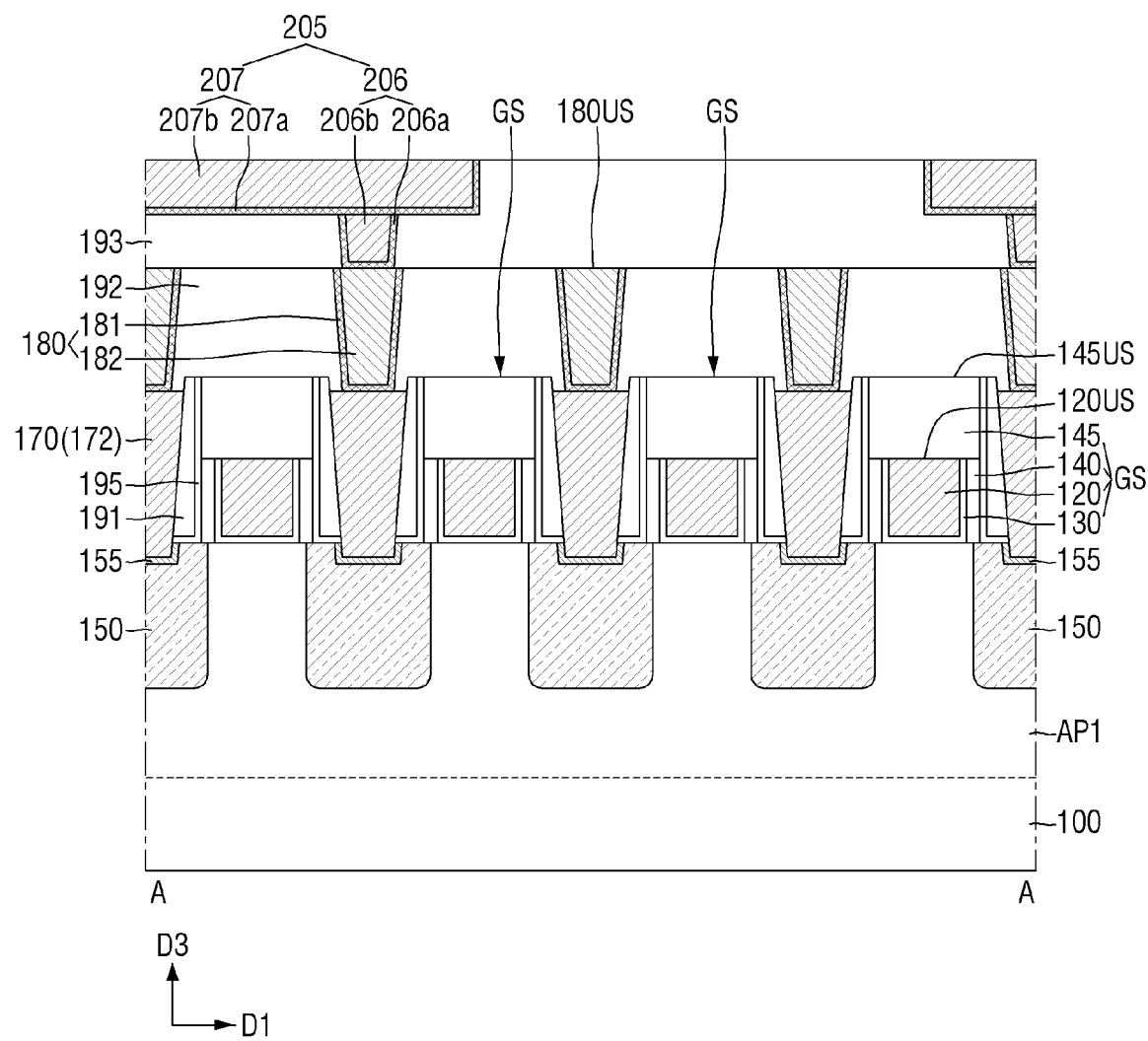
FIG. 15 is a diagram of a semiconductor device according to some embodiments.
Figure 16:
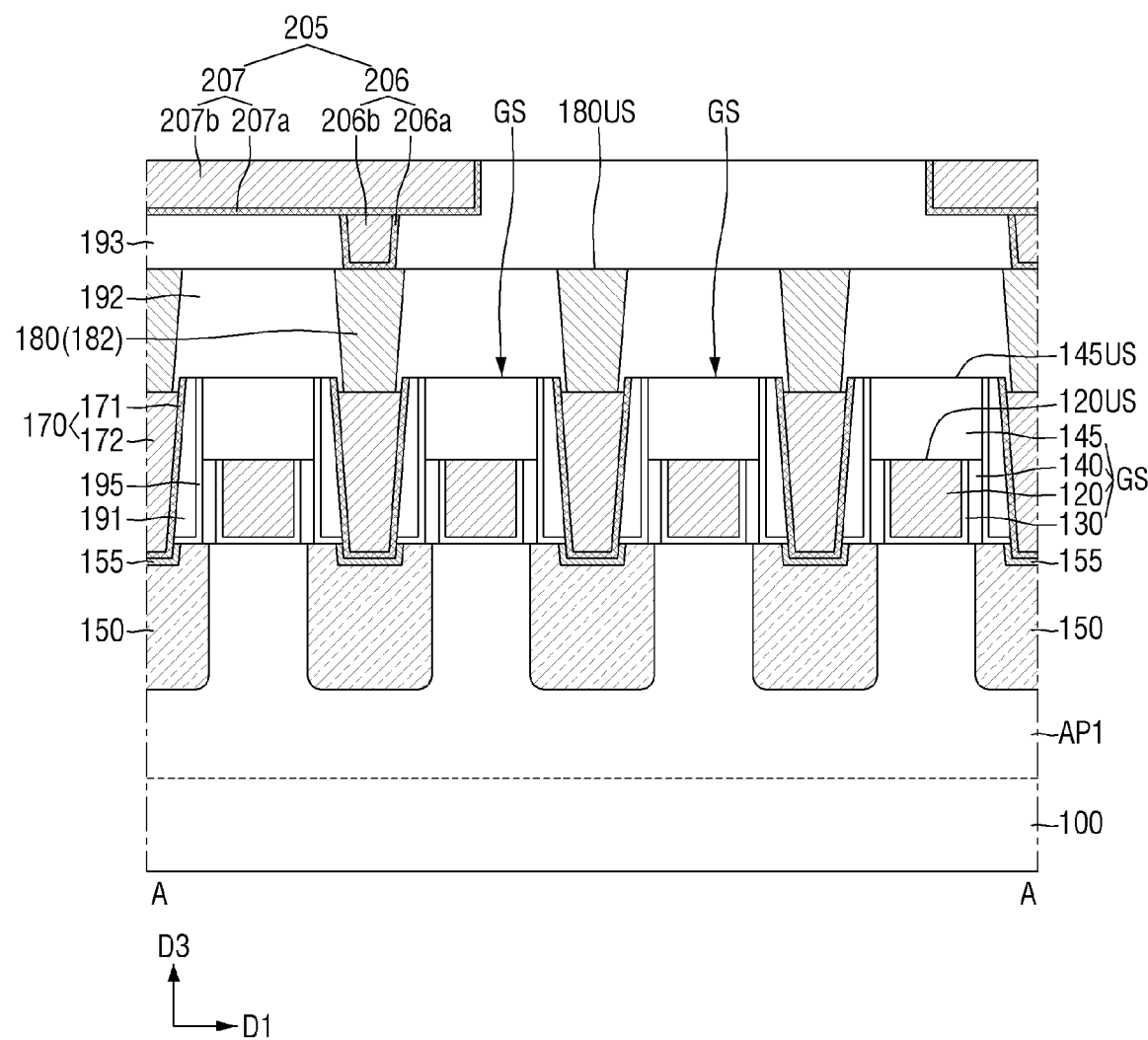
FIG. 16 is a diagram of a semiconductor device according to some embodiments.

FIG. 15 is a diagram illustrating a semiconductor device according to some embodiments. FIG. 16 is a diagram illustrating a semiconductor device according to some embodiments. For simplicity of description, the following description will focus on differences from the description with reference to FIGS. 1 to 5.

Referring to FIG. 15, in the semiconductor device according to some embodiments, the first source/drain contact 170 may have an integrated structure formed of a single layer.

The first source/drain contact 170 may include only the source/drain contact filling 172 without the source/drain contact barrier (171 in FIG. 2). The source/drain contact filling 172 may directly contact the contact silicide layer 155.

The second source/drain contact (175 in FIG. 1) may also have a structure similar to that of the first source/drain contact 170. For example, the gate contact (160 in FIG. 5) may also have a structure similar to that of the first source/drain contact 170. As another example, the gate contact (160 in FIG. 5) may include a gate contact barrier (161 in FIG. 5) and a gate contact filling (162 in FIG. 5).

Referring to FIG. 16, in the semiconductor device according to some embodiments, the first connection contact 180 may have an integrated structure formed of a single layer. The first connection contact 180 may include only the first connection contact filling 182 without the first connection contact barrier (181 in FIG. 2). The first connection contact filling 182 may directly contact the source/drain contact filling 172.

The second connection contact (185 in FIG. 5) may also have a structure similar to that of the first connection contact 180.

Figure 17:
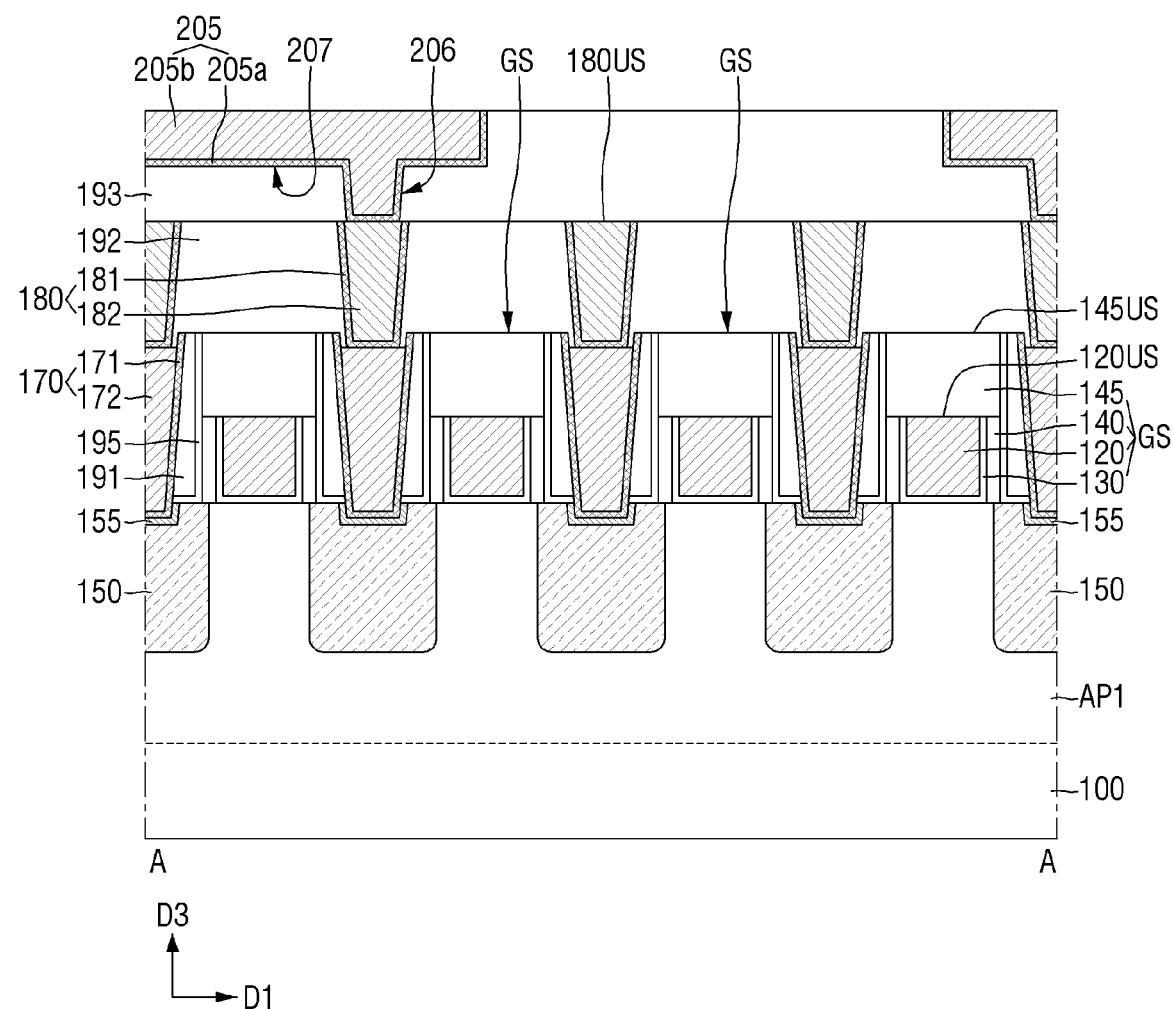
FIG. 17 is a diagram of a semiconductor device according to some embodiments.

FIGS. 17 to 10 are diagrams illustrating semiconductor devices according to some embodiments. For simplicity of description, the following description will focus on differences from the description with reference to FIGS. 1 to 5.

Referring to FIG. 17, in the semiconductor device according to some embodiments, the wiring structure 205 may include a wiring structure barrier layer 205a and a wiring structure filling layer 205b. For example, the via 206 and the wiring line 207 may each include a wiring structure barrier layer 205a and a wiring structure filling layer 205b. The wiring structure filling layer 205b of the via 206 is directly connected to the wiring structure filling layer 205b of the wiring line 207. In another example, the wiring structure 205 may include only the wiring structure filling layer 205b formed of a single layer.

Figure 18:
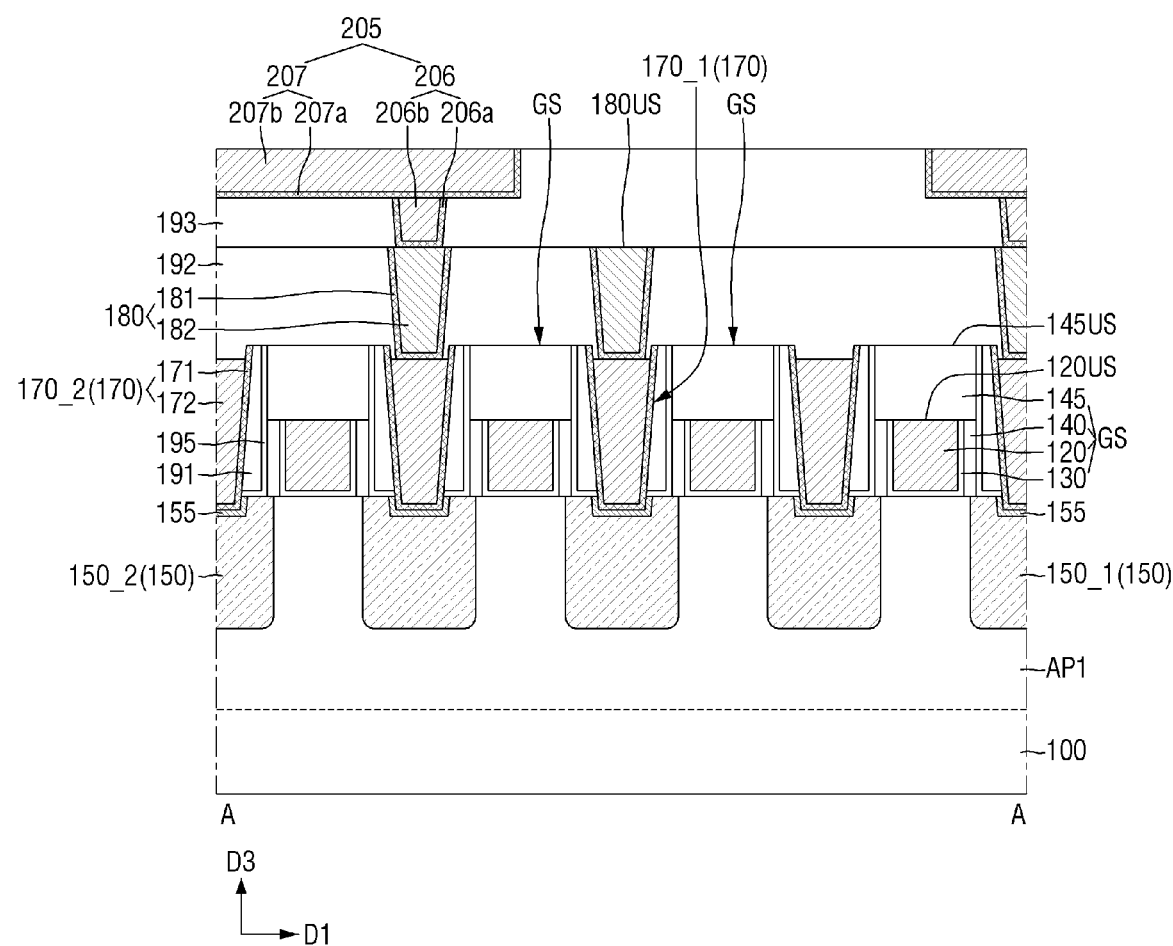
FIG. 18 is a diagram of a semiconductor device according to some embodiments.

Referring to FIG. 18, in the semiconductor device according to some embodiments, the first source/drain contact 170 may include a first first source/drain contact 170_1 and a first second source/drain contact 170_2. In cross-sectional view, a contact in which the first connection contact 180 is disposed on the first source/drain contact 170 may be the first first source/drain contact 170_1. In cross-sectional view, a contact in which the first connection contact 180 is not disposed on the first source/drain contact 170 may be the first second source/drain contact 170_2.

The entire top surface 172US of the source/drain contact filling included in the first first source/drain contact 170_1 and the first second source/drain contact 170_2 is lower than the top surface 145US of the gate structure. The source/drain pattern 150 may include a first source/drain pattern 150_1 connected to the first first source/drain contact 170_1, and a second source/drain pattern 150_2 connected to the first second source/drain contact 170_2.

Figure 19:
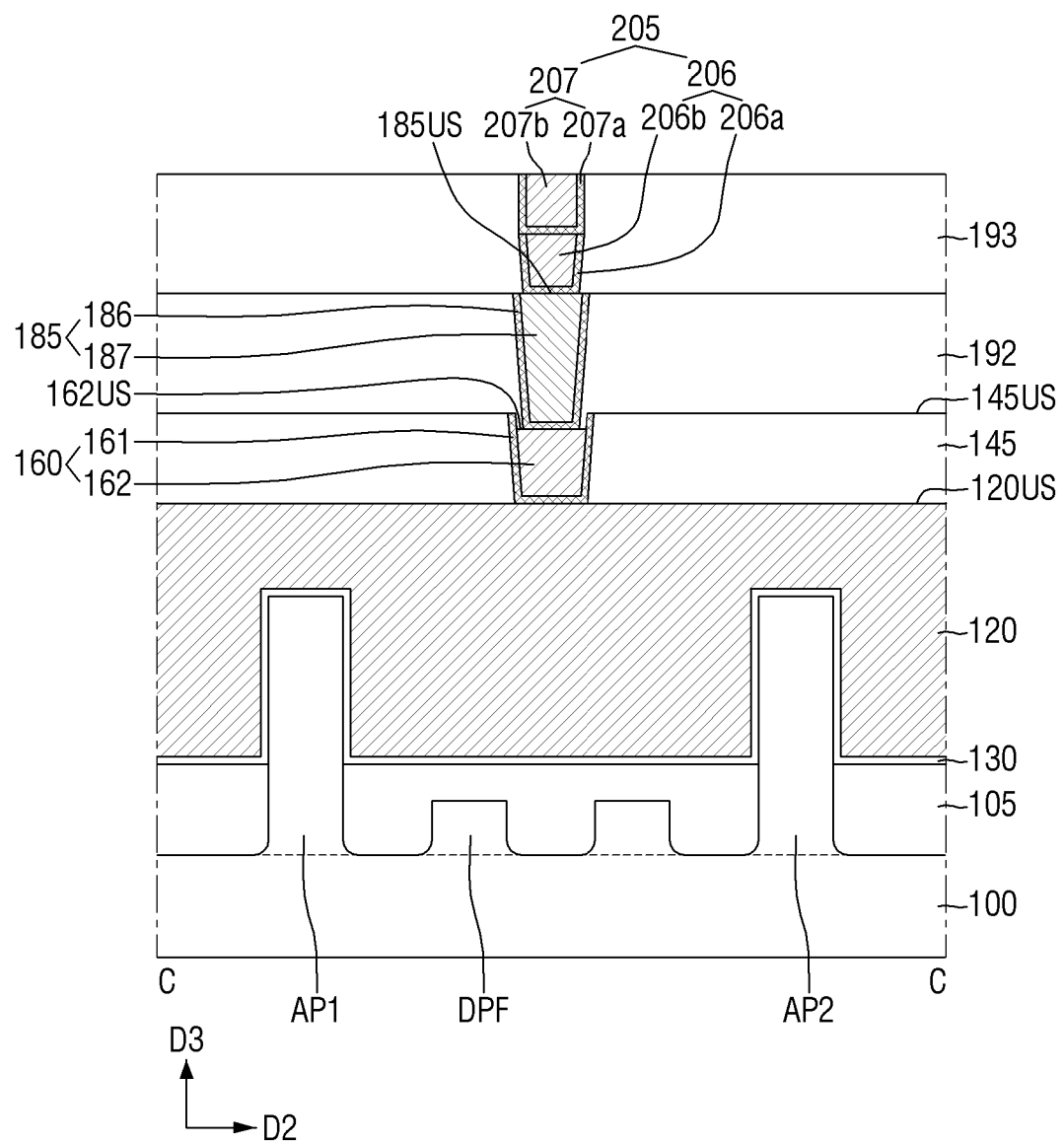
FIG. 19 is a diagram of a semiconductor device according to some embodiments.

Referring to FIG. 19, the semiconductor device according to some embodiments may include a dummy protruding pattern DPF disposed between the first active pattern AP1 and the second active pattern AP2. A deep trench (DT in FIG. 5) defining an active region is not formed between the first active pattern AP1 and the second active pattern AP2. The top surface of the dummy protruding pattern DPF may be covered by the field insulating layer 105.

Figure 20:
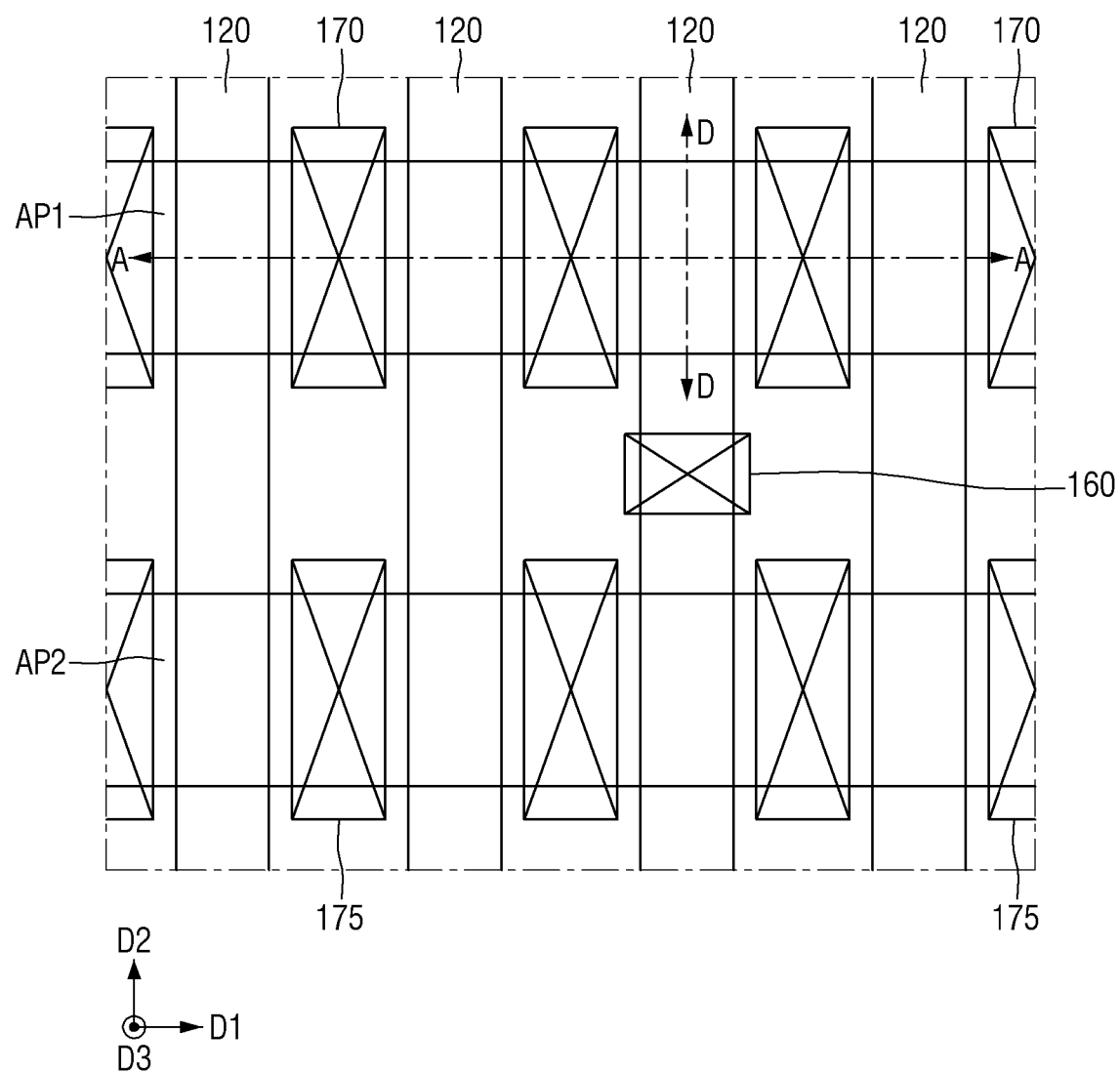
FIG. 20 is a layout diagram of a semiconductor device according to some embodiments.
Figure 21A:
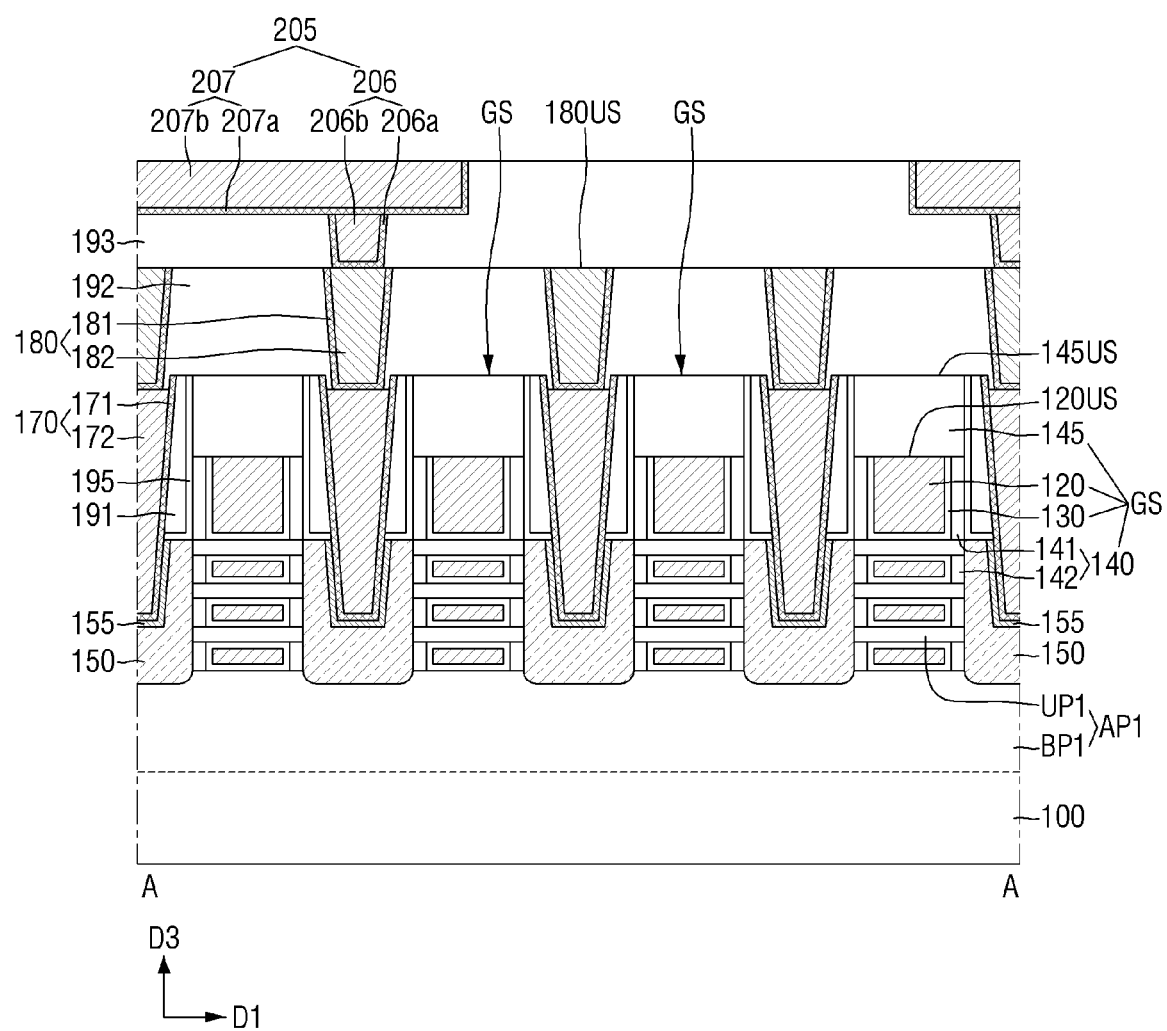
FIGS. 21A and 21B are cross-sectional views along line A-A of FIG. 20.
Figure 21B:
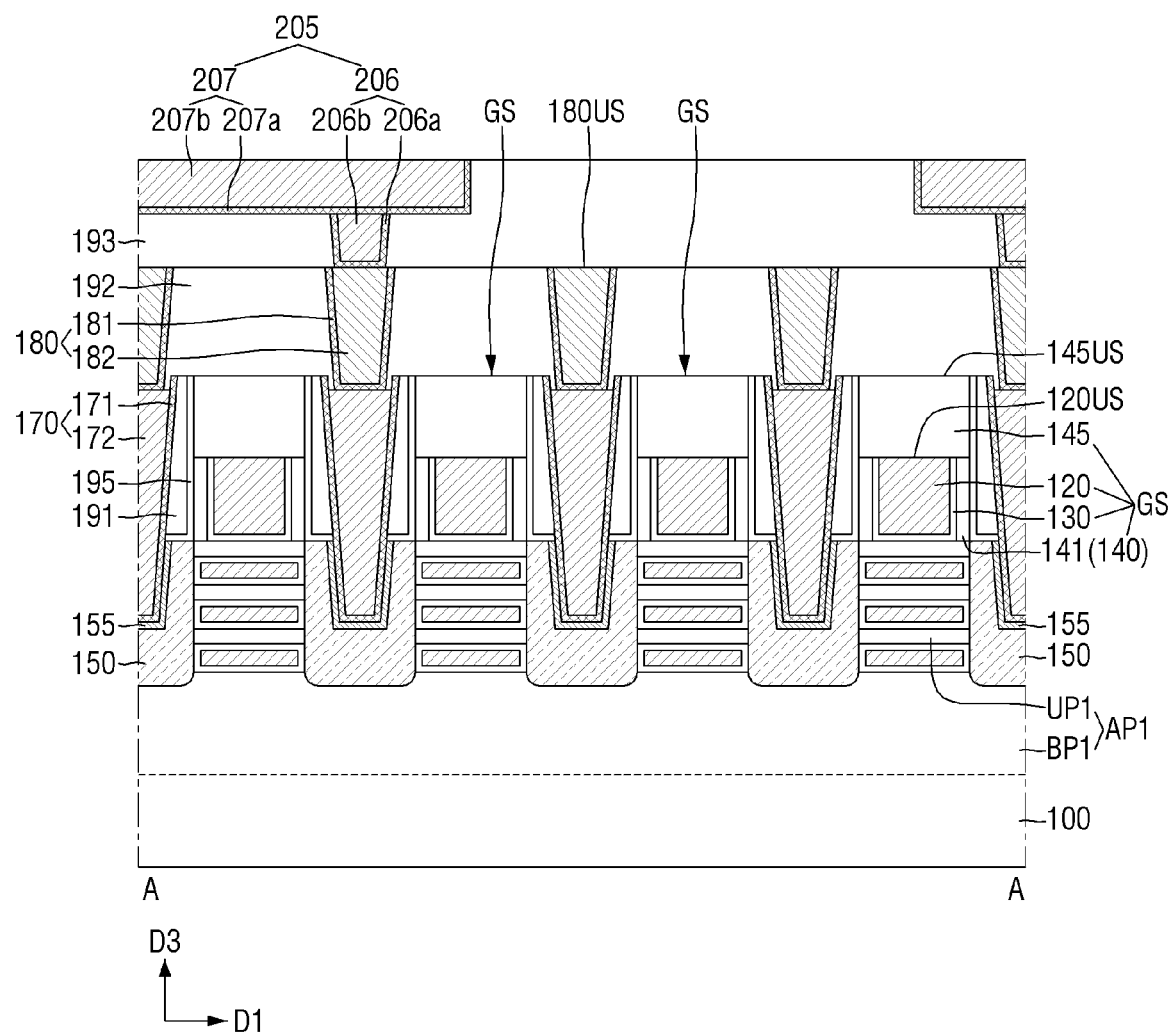
Figure 22:
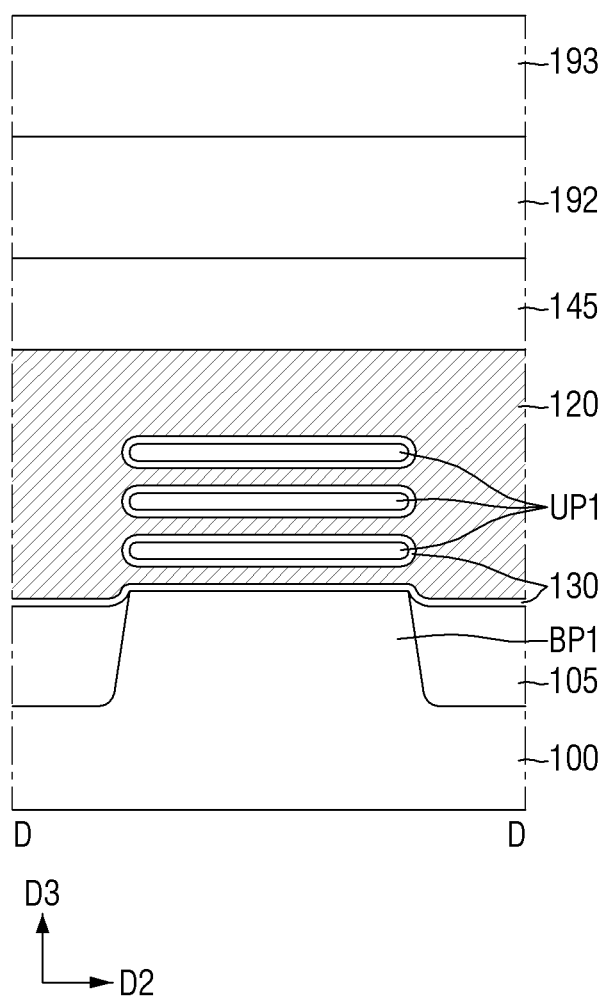
FIG. 22 is a cross-sectional view along line D-D of FIG. 20.

FIG. 20 is an exemplary layout diagram illustrating a semiconductor device according to some embodiments. FIGS. 21A and 21B are cross-sectional views taken along line A-A of FIG. 20. FIG. 22 is a cross-sectional view taken along line D-D of FIG. 20. For simplicity of description, the following description will focus on differences relative to the description with reference to FIGS. 1 to 5.

Referring to FIGS. 20 to 22, in the semiconductor device according to some embodiments, the first active pattern AP1 may include a lower pattern BP1 and a sheet pattern UP1. The second active pattern AP2 may include a lower pattern and a sheet pattern in a similar configuration to that of the first active pattern AP1.

The lower pattern BP1 may extend along the first direction D1. The sheet pattern UP1 may be disposed on the lower pattern BP1 to be spaced apart from the lower pattern BP1, e.g., along the third direction D3. The sheet pattern UP1 may include a plurality of sheet patterns. Although three sheet patterns UP1 are illustrated for simplicity of description, the present disclosure is not limited thereto.

The sheet pattern UP1 may be connected to the source/drain pattern 150. Each of the sheet patterns UP1 may be a channel pattern used as a channel region of a transistor. For example, the sheet pattern UP1 may be a nanosheet or nanowire.

The gate insulating layer 130 may extend along the top surface of the lower pattern BP1 and the top surface of the field insulating layer 105. The gate insulating layer 130 may wrap around the sheet pattern UP1.

The gate electrode 120 may be disposed on the lower pattern BP1. The gate electrode 120 may intersect the lower pattern BP1. The gate electrode 120 may wrap around the sheet pattern UP1. The gate electrode 120 may be disposed between the lower pattern BP1 and the sheet pattern UP1, and between the adjacent sheet patterns UP1.

In FIG. 21A, the gate spacer 140 may include an outer spacer 141 and an inner spacer 142. The inner spacer 142 may be disposed between the lower pattern BP1 and the sheet pattern UP1, and between adjacent ones of the sheet patterns UP1.

In FIG. 21B, the gate spacer 140 may include only the outer spacer 141. That is, the inner spacer is not disposed between the lower pattern BP1 and the sheet pattern UP1, and between the adjacent sheet patterns UP1. The bottom surface of the first source/drain contact 170 may be located between the top surface of the sheet pattern UP1 disposed at the lowermost part of the plurality of sheet patterns UP1 and the bottom surface of the sheet pattern UP1 disposed at the uppermost part thereof.

By way of summation and review, as a pitch (size) of the semiconductor device decreases, there is to decrease capacitance and secure electrical stability between contacts in the semiconductor device. Therefore, according to embodiments, a semiconductor device includes a source/drain contact filling having its entire top surface lower than a top surface of the gate structure, and a connection contact having its top surface higher than the top surface of the gate structure. As such, parasitic capacitance between the source/drain contact filling and the gate electrode is reduced, and resistance between the source/drain pattern and the wiring structure is reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a gate structure on the substrate;
a source/drain pattern on the substrate, the source/drain pattern being at a side of the gate structure;
a source/drain contact filling on and connected to the source/drain pattern, an entire top surface of the source/drain contact filling being lower than a top surface of the gate structure;
a source/drain contact barrier extending along a sidewall of the source/drain contact filling;
a connection contact directly on and connected to the source/drain contact filling, a top surface of the connection contact being higher than the top surface of the gate structure; and
an insulating layer surrounding the connection contact and directly contacting a portion of the top surface of the source/drain contact filling, a bottommost surface of the insulating layer and a top surface of the source/drain contact barrier being on different levels.

2. The semiconductor device as claimed in claim 1, wherein the source/drain contact filling is within at least a part of a filling recess defined by the source/drain contact barrier.

3. The semiconductor device as claimed in claim 1, wherein the source/drain contact barrier protrudes above the top surface of the source/drain contact filling.

4. The semiconductor device as claimed in claim 1, further comprising a contact silicide layer between the source/drain pattern and the source/drain contact filling, the contact silicide layer being in direct contact with the source/drain contact filling.

5. The semiconductor device as claimed in claim 1, further comprising a wiring structure on the connection contact, the wiring structure including a via directly connected to the connection contact and a wiring line connected to the via.

6. The semiconductor device as claimed in claim 1, wherein the connection contact includes a connection contact filling and a connection contact barrier extending at least along a bottom surface of the connection contact filling.

7. The semiconductor device as claimed in claim 6, wherein the connection contact barrier further extends along a sidewall of the connection contact filling.

8. The semiconductor device as claimed in claim 1, wherein the connection contact is a single layer.

9. The semiconductor device as claimed in claim 1, wherein the gate structure includes a gate electrode and a gate capping pattern on the gate electrode, the entire top surface of the source/drain contact filling being lower than a top surface of the gate capping pattern and higher than a top surface of the gate electrode.

10. The semiconductor device as claimed in claim 1, wherein at least a portion of the top surface of the source/drain contact filling extends horizontally beyond the bottommost surface of the connection contact.

11. A semiconductor device, comprising:
a substrate;
a gate structure on the substrate, the gate structure including a gate electrode and a gate capping pattern on the gate electrode;
a source/drain pattern on the substrate, the source/drain pattern being at a side of the gate structure;
a source/drain contact on and connected to the source/drain pattern; and
a connection contact directly on and connected to the source/drain contact, the connection contact including a connection contact filling and a connection contact barrier extending at least along a bottom surface of the connection contact filling,
wherein a top surface of the connection contact filling is higher than a top surface of the gate structure, and a bottom surface of the connection contact barrier is lower than the top surface of the gate structure,
wherein the source/drain contact includes a source/drain contact barrier defining a recess, and a source/drain contact filling within at least a part of the recess,
wherein a top surface of the source/drain contact barrier and a bottommost surface of the connection contact barrier are on different levels, and
wherein an insulating layer fills a portion between the source/drain contact barrier and the connection contact barrier.

12. The semiconductor device as claimed in claim 11, wherein an entire top surface of the source/drain contact filling is lower than the top surface of the gate structure.

13. The semiconductor device as claimed in claim 11, wherein the source/drain contact barrier protrudes above the entire top surface of the source/drain contact filling.

14. The semiconductor device as claimed in claim 11, further comprising a gate contact connected to the gate electrode through the gate capping pattern, the gate contact including a gate contact barrier and a gate contact filling on the gate contact barrier, and a top surface of the gate contact filling being lower than the top surface of the gate structure.

15. A semiconductor device, comprising:
a substrate including an upper surface with active patterns;
a multi-channel active pattern on the substrate;
a gate structure on the multi-channel active pattern, the gate structure including a gate electrode and a gate capping pattern on the gate electrode;
a source/drain pattern on the multi-channel active pattern, the source/drain pattern being at a side of the gate structure;
a source/drain contact on and connected to the source/drain pattern, the source/drain contact including a source/drain contact barrier on a source/drain contact filling, and an entire top surface of the source/drain contact filling being lower than a top surface of the gate capping pattern;
a connection contact directly on and connected to the source/drain contact, a width of a bottommost surface of the connection contact being smaller than a width of the entire top surface of the source/drain contact filling;
a wiring structure on and connected to the connection contact, the wiring structure including a via directly connected to the connection contact and a wiring line connected to the via; and
an insulating layer surrounding the connection contact and directly contacting a portion of the top surface of the source/drain contact filling, a distance between a bottommost surface of the insulating layer and the upper surface of the substrate being smaller than a distance between a top surface of the source/drain contact barrier and the upper surface of the substrate.

16. The semiconductor device as claimed in claim 15, wherein the connection contact includes a connection contact filling and a connection contact barrier extending at least along a bottom surface of the connection contact filling.

17. The semiconductor device as claimed in claim 16, wherein the connection contact barrier further extends along a sidewall of the connection contact filling.

18. The semiconductor device as claimed in claim 16, wherein a bottom surface of the connection contact filling is lower than a topmost surface of the source/drain contact barrier.

19. The semiconductor device as claimed in claim 15, wherein the source/drain contact includes a contact trench defined by the top surface of the source/drain contact filling and the source/drain contact barrier protruding above the top surface of the source/drain contact filling, a part of the connection contact being in the contact trench.

20. The semiconductor device as claimed in claim 15, wherein the multi-channel active pattern includes a lower pattern and a sheet pattern spaced apart from the lower pattern, the gate electrode wrapping around the sheet pattern.

* * * * *